(12) United States Patent
Sato et al.

(10) Patent No.: US 7,248,349 B2
(45) Date of Patent: Jul. 24, 2007

(54) EXPOSURE METHOD FOR CORRECTING A FOCAL POINT, AND A METHOD FOR MANUFACTURING A SEMICONDUCTOR DEVICE

(75) Inventors: Takashi Sato, Fujisawa (JP); Shoji Mimotogi, Yokohama (JP); Takahiro Ikeda, Yokohama (JP); Soichi Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/220,701

(22) Filed: Sep. 8, 2005

(65) Prior Publication Data

US 2006/0061756 A1    Mar. 23, 2006

Related U.S. Application Data

(62) Division of application No. 10/287,522, filed on Nov. 5, 2002, now Pat. No. 6,967,719.

(30) Foreign Application Priority Data

Nov. 6, 2001    (JP)    ............................. 2001-341039

(51) Int. Cl.
*G01B 9/00* (2006.01)
*G01B 11/00* (2006.01)
*G03F 9/00* (2006.01)
*G03C 5/00* (2006.01)

(52) U.S. Cl. .................. 356/124; 356/401; 430/22; 430/30

(58) Field of Classification Search .................. None
See application file for complete search history.

(56) References Cited

U.S. PATENT DOCUMENTS 5,208,629 A    5/1993    Matsuo et al.

(Continued)

FOREIGN PATENT DOCUMENTS

| EP | 1422562 A1 | 5/2004 |
|---|---|---|
| JP | 06-120116 A | 4/1994 |
| JP | 7-254551 | 10/1995 |
| JP | 09-237752 A | 9/1997 |
| JP | 2001-250760 A | 9/2001 |
| JP | 2001-250769 | 9/2001 |
| KR | 1998-067515 A | 10/1998 |

OTHER PUBLICATIONS

Notification of the First Office Action from the State Intellectual Property Office of the People's Republic of China dated Mar. 25, 2005, in patent application No. 02149225.5, and English translation.

(Continued)

*Primary Examiner*—Gregory J. Toatley, Jr.
*Assistant Examiner*—Gordon J. Stock, Jr.
(74) *Attorney, Agent, or Firm*—Finnegan, Henderson, Farabow, Garrett & Dunner, L.L.P.

(57) ABSTRACT

There is disclosed an exposure method for correcting a focal point, comprising: illuminating a mask, in which a mask-pattern including at least a set of a first mask-pattern and a second mask-pattern mutually different in shape is formed, from a direction in which a point located off an optical axis of an exposure apparatus is a center of illumination, and exposing and projecting an image of said mask-pattern toward an image-receiving element; measuring a mutual relative distance between images of said first and second mask-patterns exposed and projected on said image-receiving element, thereby measuring a focal point of a projecting optical system of said exposure apparatus; and moving said image-receiving element along a direction of said optical axis of said exposure apparatus on a basis of a result of said measurement, and disposing said image-receiving element at an appropriate focal point of said projecting optical system.

15 Claims, 13 Drawing Sheets

U.S. PATENT DOCUMENTS

| | | | |
|---|---|---|---|
| 5,331,369 | A | 7/1994 | Terasawa et al. |
| 6,088,113 | A | 7/2000 | Kim |
| 6,633,390 | B2 | 10/2003 | Shiode et al. |
| 6,701,512 | B2 | 3/2004 | Sutani et al. |
| 6,743,554 | B2 * | 6/2004 | Nakao ............................ 430/5 |
| 6,764,794 | B2 * | 7/2004 | Nakao et al. ................... 430/5 |
| 6,797,443 | B2 * | 9/2004 | Nakao et al. ................... 430/30 |
| 6,811,939 | B2 * | 11/2004 | Nakao et al. ................... 430/30 |
| 2002/0155356 | A1 | 10/2002 | Masashi |
| 2003/0091913 | A1 | 5/2003 | Shiode |

OTHER PUBLICATIONS

Office Action from Korean Intellectual Property Office, Dec. 6, 2004.

Seong, Nakegeuon et al., *Pattern Displacement Error under Off Axis Illumination*, Jpn. J. Appl. Phys., vol. 37, Dec. 1998, pp. 6695-6697.

Netherlands Bureau for Industrial Property Search Report, Aug. 26, 2004.

Brunner et al., IBM, "Quantitative Stepper Metrology Using The Focus Monitor Test Mask", SPIE vol. 2197 (1994), pp. 541-549.

Brunner et al., IBM, Simulations And Experiments With The Phase Shift Focus Monitor:, SPIE vol. 2726 (1996), pp. 236-243.

Nakao et al., Mitsubishi Electric Corp., Extended Abstracts (The 48th Spring Meeting, 2001); The Japan Society of Applied Physics and Related Societies (Mar. 2001), p. 733.

Takashi Sato et al., *Coma Aberration Measurement by Relative Shift of Displacement with Pattern Dependence*, Japanese Journal of Applied Physics, vol. 37, pp. 3553-3557 (1998).

Hiroshi Nomura et al., *Techniques for Measuring Aberrations in Lenses Used in Photolithography with Printed Patterns*, Applied Optics, vol. 38, No. 13, pp. 2800-2807, May 1, 1999.

\* cited by examiner

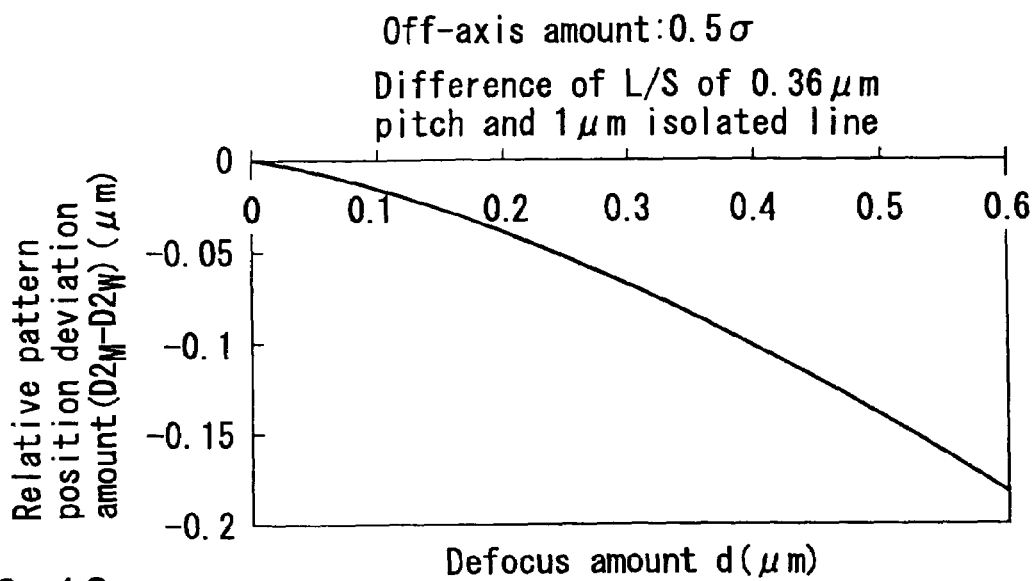
FIG. 19
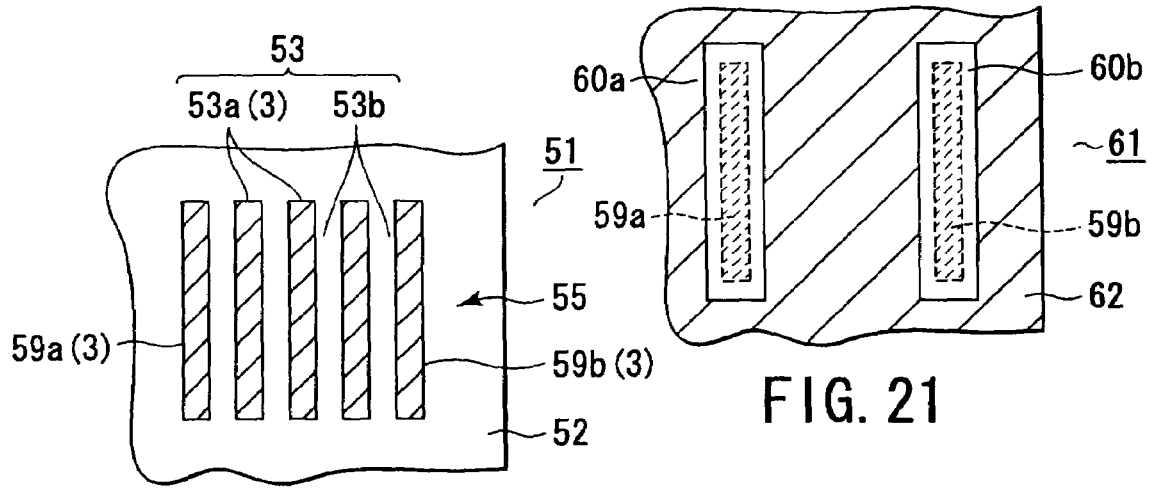
FIG. 20
FIG. 21
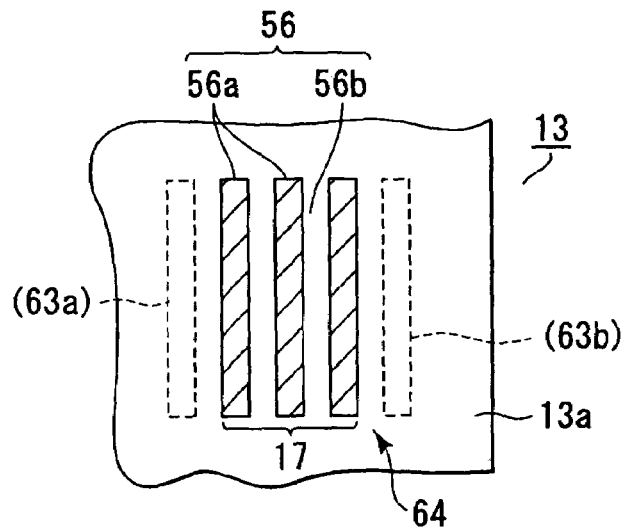
FIG. 22

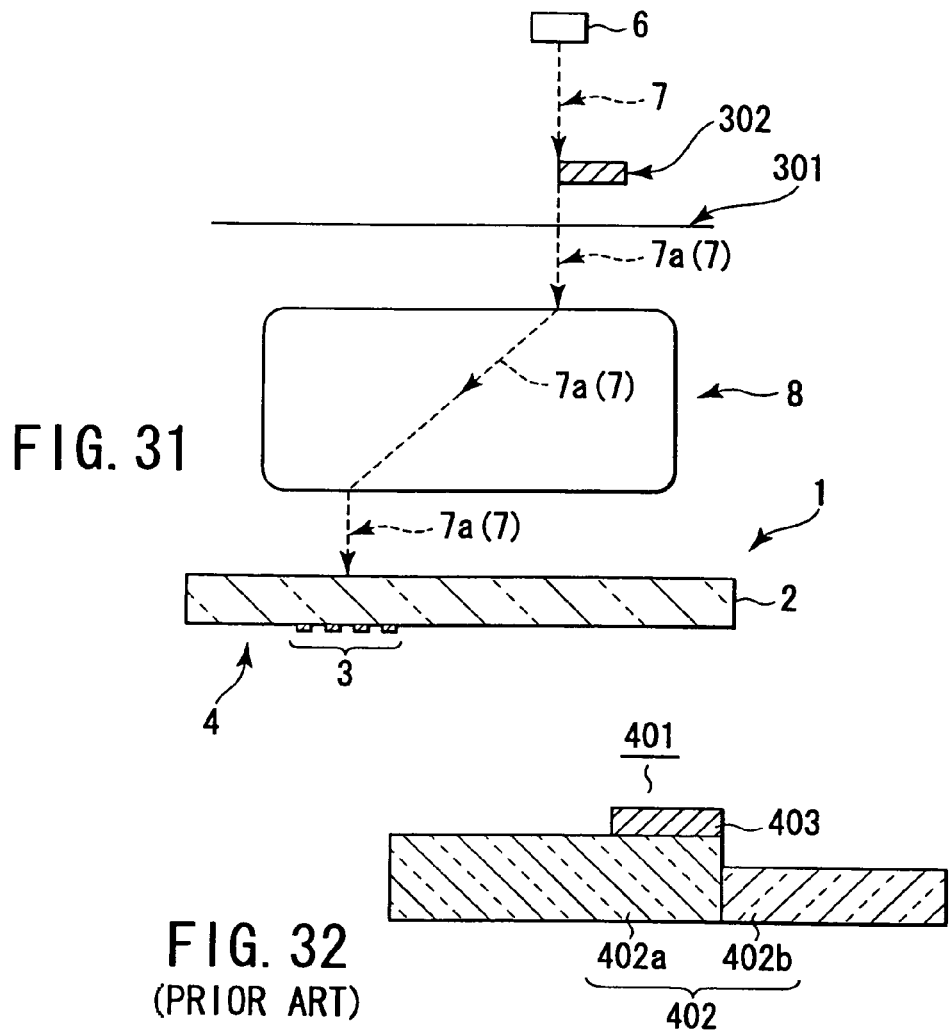
FIG. 31
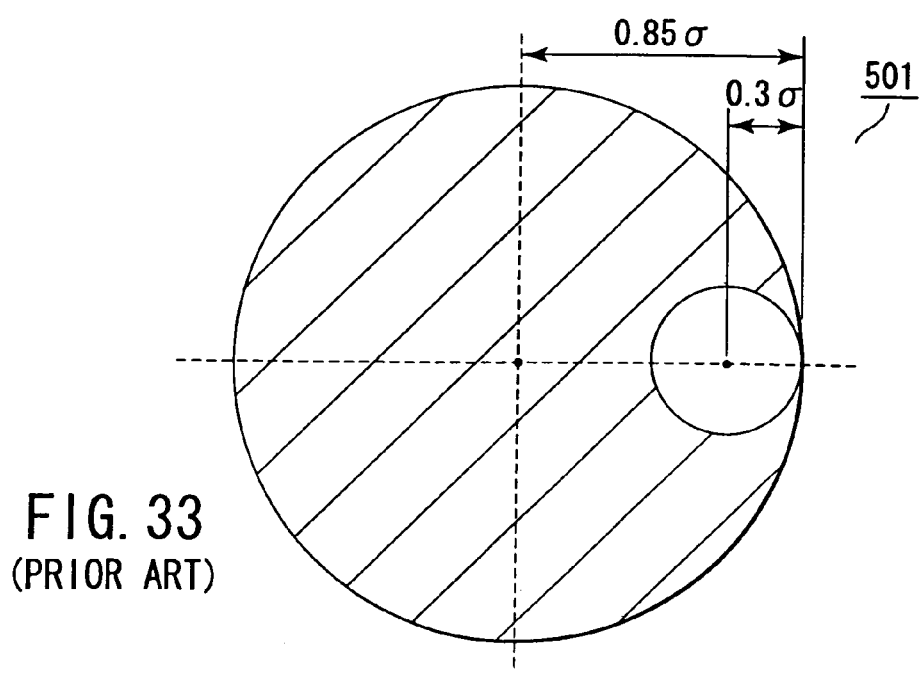
FIG. 32
(PRIOR ART)
FIG. 33
(PRIOR ART)

EXPOSURE METHOD FOR CORRECTING A FOCAL POINT, AND A METHOD FOR MANUFACTURING A SEMICONDUCTOR DEVICE

CROSS-REFERENCE TO RELATED APPLICATIONS

This application is a divisional of application Ser. No. 10/287,522, filed Nov. 5, 2002 now U.S. Pat. No. 6,967,719, the entire contents of which are incorporated herein by reference.

This application is based upon and claims the benefit of priority from the prior Japanese Patent Application No. 2001-341039, filed Nov. 6, 2001, the entire contents of which are incorporated herein by reference.

BACKGROUND OF THE INVENTION

1. Field of the Invention

The present invention relates to a method for inspecting a state of an optical system of an exposure apparatus for use in a semiconductor photo-lithographic process, an exposure method for correcting a focal point, and a method for manufacturing a semiconductor device by using an exposure apparatus.

2. Description of the Related Art

In a general photolithographic process, when forming a fine resist-pattern by using a projection exposure apparatus (stepper), unless a state of an optical system of the exposure apparatus, especially a focal point of the exposure apparatus is set in an appropriate state, it is likely to be out of focus, and it is hard to form a fine pattern as desired. Recently, as the transfer-pattern is becoming much finer, it is very important to set the precision of the focal point of the exposure apparatus.

For example, in a semiconductor device of design rule of 0.13 μm, the focal depth is less than 0.5 μm. In this case, it is preferred to set the precision of the focal point at higher precision than 1/10 of the focal depth. Therefore, the focal point must be set at a precision of at least 0.05 μm. Needless to say, if the setting is high in repeatability, it is meaningless unless the true focal point can be measured precisely. Thus, when manufacturing a semiconductor device of which design rule is 0.13 μm, it is important to measure or monitor the focal point of the exposure apparatus at least at a precision of 0.05 μm.

As briefly described above by referring to a specific example, various techniques are developed for monitoring accurately the focal point of the exposure apparatus, for example, from a transfer-pattern by exposure.

One of such techniques is a monitoring technique by using a phase-shift-pattern. A representative example is disclosed by Timothy Brunner et al. of International Business Machine Corporation (IBM) in page 541 to 549 of Proc. SPIE vol. 2197 (1994) and in page 236 to 243 of Proc. SPIE vol. 2726 (1996).

This method uses an original plate mask 401 having a sectional structure as shown in FIG. 32. The original plate mask 401 comprises a light permeable mask main body 402, and a chromium-made shield 403, and a mask-pattern for monitoring (not shown) to be transferred on a semiconductor substrate by exposure is formed on a principal plane of the mask main body 402. As its sectional structure is shown in FIG. 32, the mask main body 402 comprises a reference plane 402a, and a plane 402b shifted in phase by 90 degrees (phase shifter plane), and the shield 403 is disposed in a boundary region of the reference plane 402a and the phase shifter plane 402b. A reference-pattern (not shown) is further disposed on the reference plane 402a.

Using the original plate mask 401 thus explained briefly, a mask-pattern is exposed on a semiconductor substrate. At this time, if the position of the semiconductor substrate, that is, the focal point of the exposure apparatus (not shown) is deviated from the best focal point, relative positions of the mask-pattern (shield) 403 formed in the boundary region of the reference plane 402a and the phase shifter plane 402b and the reference-pattern (not shown) on the reference plane 402a being transferred on the semiconductor substrate are changed. In this case, a deviation amount of the semiconductor substrate from the best focal point and a relative position deviation amount are known to have a mutually linear relation. This method proposed by Timothy Brunner et al. is intended to monitor accurately the focal point of the exposure apparatus by perceiving the position deviation amount of each transfer-pattern by means of, for example, a so-called overlay inspection system, and applying this result in the linear relation.

According to this method, by inspecting plural transfer-patterns exposed by varying the position of the semiconductor substrate, it skips the procedure of determining the best focal point of the exposure apparatus. That is, the inspection-pattern for measuring the focal point of the exposure apparatus is formed by one exposure, and by measuring this inspection-pattern, the best focal point of the exposure apparatus can be determined.

Similar to the monitoring method for Timothy Brunner et al., recently, a monitoring technique of the focal point of the exposure apparatus by measuring the position deviation amount of patterns by using the overlay inspection system is disclosed by Shuji Nakao et al. of Mitsubishi Electric Corporation in page 733 of Extended Abstracts (The 48th Spring Meeting, 2001); The Japan Society of Applied Physics and Related Societies (March, 2001). In this method, instead of using a special mask having the phase shifter 402b formed therein as in the case above, by using a general mask having an inspection mask-pattern formed therein by an ordinary light permeable film-pattern of chromium, it is intended to monitor the focal point of the exposure apparatus.

In this method, when standardized optically by using coherency σ of an illuminating light source of the exposure apparatus, it is characterized by using an illuminating aperture 501 that can be expressed schematically in the size and shape as shown in FIG. 33. First, the illuminating aperture 501 is disposed at the secondary light source side of the exposure apparatus so that a center of the illuminating light source of the exposure apparatus (not shown) may come to an off-axis point, substantially located off an optical axis of the exposure apparatus. In such off-axis illuminating condition, a pattern of a relatively large size, for example, 2 μm is exposed. Similarly, a pattern of 2 μm is exposed in the illuminating condition in which the center of the illuminating light source may substantially come to the central position of the optical axis. However, when exposing in these two different illuminating conditions, double exposure is executed so that each exposed pattern may be a so-called box-in-box-inspection-pattern. More specifically, double exposure is executed so that the pattern formed in the off-axis illuminating condition may come to the inside box, and that the pattern formed in the axis-center illuminating condition may come to the outside box.

The pattern exposed in the off-axis illuminating condition is deviated in position while keeping the substantially linear relation depending on the deviation amount of the focal point, whereas the pattern exposed in the axis-center illuminating condition is not deviated in position even if the focal point is changed. In this method, therefore, by measuring the relative position deviation of an inside pattern and an outside pattern of the box-in-box-inspection-pattern by a overlay inspection system, it is designed to measure the focal point of the exposure apparatus at the time of exposure.

The reason why this method can be executed is that, when projecting a relatively thick pattern, it is possible to project by the diffraction light near the principal ray only because the ray for illuminating a thick pattern on the mask is hardly diffracted by spreading at a wide angle when passing through the mask. In this method, the pattern formed on the mask may be a pattern made of an ordinary shielding film, and any special phase-shift-pattern is not needed.

In the monitoring method proposed by Timothy Brunner et al., the original plate mask 401 requires a phase shifter 402*b* for inducing a phase shift of 90 degrees that is not required usually. As a result, the manufacturing cost of the mask is increased.

In the monitoring method proposed by Shuji Nakao et al. of Mitsubishi Electric Corporation, the inspection-pattern (measurement-pattern) cannot be transferred unless double exposures are executed. Therefore, when the focus monitor by this method is applied in the field of mass production, the time required for exposure increases, and the productivity is lowered. To measure the focal point at high precision in this method, it is required to read the position deviation amount of the measurement-pattern at a precision of several nanometers. Accordingly, at the time of double exposure, the mask and transfer substrate must be fixed so as not to be moved between the first exposure and the second exposure. In such a case of reading at a precision of several nanometers, in order to assure the precision necessary for measurement, it is required to continue to hold the position of the mask and transfer substrate at a positional precision of several times higher, that is, 1 nm or less. It is, however, very difficult to continue to hold the position of the mask and transfer substrate (image-receiving element) at such precision even by the latest high control technology.

Further, if these problems exist, it is hard to transfer the mask-pattern in an appropriate shape, or it is difficult to manufacture favorable semiconductor devices capable of exhibiting the desired performance.

BRIEF SUMMARY OF THE INVENTION

According to an aspect of the invention, there is provided an exposure method for correcting a focal point, comprising: illuminating a mask, in which a mask-pattern including at least a set of a first mask-pattern and a second mask-pattern mutually different in shape is formed, from a direction in which a point located off an optical axis of an exposure apparatus is a center of illumination, and exposing and projecting an image of said mask-pattern toward an image-receiving element; measuring a mutual relative distance between images of said first and second mask-patterns exposed and projected on said image-receiving element, thereby measuring a focal point of a projecting optical system of said exposure apparatus; and moving said image-receiving element along a direction of said optical axis of said exposure apparatus on a basis of a result of said measurement, and disposing said image-receiving element at an appropriate focal point of said projecting optical system.

According to another aspect of the invention, there is provided a method for manufacturing a semiconductor device, comprising: illuminating a mask, in which a mask-pattern including at least a set of a first mask-pattern and a second mask-pattern mutually different in shape is formed, from a direction in which a point located off an optical axis of an exposure apparatus is a center of illumination, and exposing and projecting an image of said mask-pattern toward an image-receiving element; measuring a mutual relative distance between images of said first and second mask-patterns exposed and projected on said image-receiving element, thereby inspecting a state of an optical system of said exposure apparatus; setting said optical system of said exposure apparatus in an appropriate state on a basis of a result of said measurement; disposing a semiconductor substrate having a photosensitive material provided thereon on a principal plane at an appropriate focal point of a projecting optical system of said exposure apparatus; and forming a resist-pattern by transferring an image of a mask-pattern for manufacturing a semiconductor on said photosensitive material.

According to yet another aspect of the invention, there is provided a method for manufacturing a semiconductor device, comprising: illuminating a mask, in which a mask-pattern including at least a set of a first mask-pattern and a second mask-pattern mutually different in shape is formed, from a direction in which a point located off an optical axis of an exposure apparatus is a center of illumination, and exposing and projecting an image of said mask-pattern toward an image-receiving element; measuring a mutual relative distance between images of said first and second mask-patterns exposed and projected on said image-receiving element, thereby measuring a focal point of a projecting optical system of said exposure apparatus; setting said focal point of said projecting optical system in an appropriate state on a basis of a result of said measurement; disposing a semiconductor substrate having a photosensitive material provided thereon on a principal plane at an appropriate focal point of said projecting optical system; and forming a resist-pattern by transferring an image of a mask-pattern for manufacturing a semiconductor on said photosensitive material.

According to still another aspect of the invention, there is provided a method for manufacturing a semiconductor device, comprising: illuminating a mask, in which a mask-pattern including at least a set of a first mask-pattern and a second mask-pattern mutually different in shape is formed, from a direction in which a point located off an optical axis of an exposure apparatus is a center of illumination, and exposing and projecting an image of said mask-pattern toward an image-receiving element; measuring a mutual relative distance between images of said first and second mask-patterns exposed and projected on said image-receiving element, thereby measuring a focal point of a projecting optical system of said exposure apparatus; setting said focal point of said projecting optical system in an appropriate state on a basis of a result of said measurement, and disposing a semiconductor substrate having a photosensitive material provided thereon on a principal plane at an appropriate focal point of said projecting optical system; and forming a resist-pattern by transferring an image of a mask-pattern for manufacturing a semiconductor on said photosensitive material.

BRIEF DESCRIPTION OF THE SEVERAL VIEWS OF THE DRAWINGS

FIG. 19 is a diagram showing the relation between the relative position deviation amount of each resist-pattern by the L/S-pattern and isolated-line-pattern of the mask in FIG. 14 and the deviation amount from the focal point of the substrate.

FIG. 20 is a plan view showing a mask having a mask-pattern formed at a predetermined period.

FIG. 21 is a plan view showing a mask having an opening formed oppositely to mask-patterns at both ends of the mask-pattern in FIG. 20.

FIG. 22 is a plan view showing resist-patterns formed on a substrate by using the masks in FIG. 20 and FIG. 21.

FIG. 31 is a diagram schematically showing a method for inspecting an exposure apparatus according to a fourth embodiment of the invention.

FIG. 32 is a sectional view schematically showing a mask for use in a method for inspecting an exposure apparatus in a prior art.

FIG. 33 is a plan view schematically showing an 15 illuminating aperture for use in the method for inspecting an exposure apparatus in the prior art.

DETAILED DESCRIPTION OF THE INVENTION

A method for inspecting an exposure apparatus, an exposure method for correcting a focal point, and a method for manufacturing a semiconductor device according to the invention will be described below, in first to fourth embodiments, while referring to FIG. 1 to FIG. 31.

First Embodiment

Figure 1:
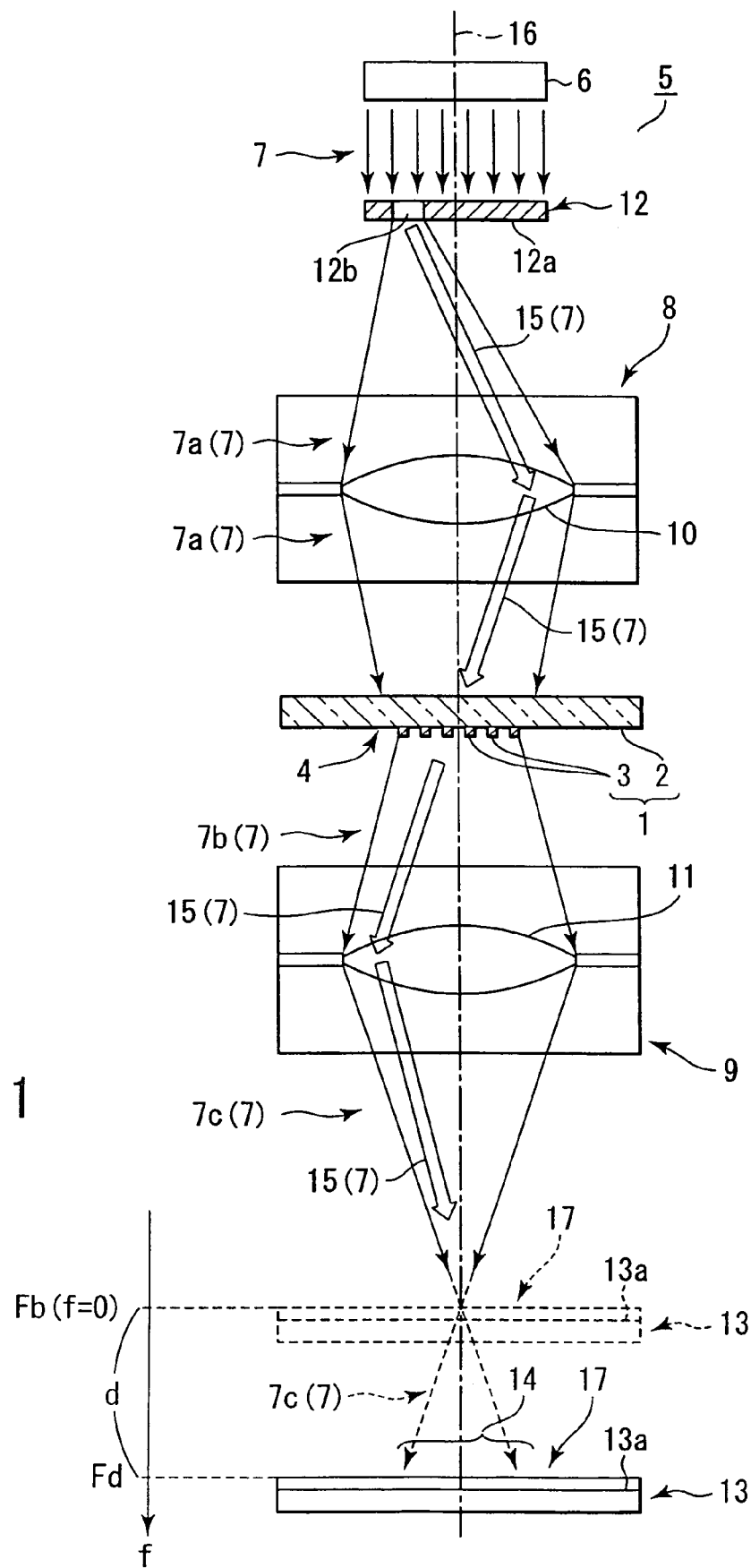
FIG. 1 is a diagram schematically showing a method for inspecting an exposure apparatus according to a first embodiment of the invention.

Prior to describing a first embodiment, a schematic configuration of a general exposure apparatus is explained by referring to FIG. 1. In FIG. 1, among various types of exposure apparatus, an exposure apparatus (stepper) 5 of reduction projection type having a so-called telecentric optical system is illustrated.

The exposure apparatus 5, as shown in FIG. 1, comprises a light source (exposure light source, illuminating light source) 6, an illuminating optical system 8, and a projecting optical system 9. The light source 6 emits an exposure light 7 including a predetermined wavelength λ. The illuminating optical system 8 guides the exposure light 7 (illuminating light 7a) emitted from the illuminating light source 6 to a mask (reticle) 1 in which a mask-pattern 4 is formed. The projecting optical system 9 guides an image of the mask-pattern 4 by the exposure light 7 (transmitting light 7b) passing through the mask 1 onto a principal plane 13a of an image-receiving element 13. Between the illuminating light source 6 and the illuminating optical system 8, that is, at the secondary light source side of the exposure apparatus 5, an illuminating aperture 12 described later is disposed. This illuminating aperture 12 is disposed so that the point substantially located off the optical axis 16 of the exposure apparatus 5 may create a state for illuminating the mask 1 (mask-pattern 4) from the direction of center of illumination.

In the case of the exposure apparatus 5 having the telecentric optical system, as indicated by single dot chain line in FIG. 1, the optical axis 16 of the exposure apparatus 5 is a straight line. The image-receiving element 13 is disposed near the focal point (f=0) of the exposure apparatus 5 (projecting optical system 9), that is, near the focal point of a projection lens 11, with the principal plane 13a on which an image 14 of the mask-pattern 4 is exposed and projected being at a position facing the projection lens 11. In FIG. 1 and others, for the ease of understanding of a ray state of the exposure light 7, the ray state of the exposure light 7 is expressed optogeometrically and schematically.

The method for inspecting an exposure apparatus of the present embodiment is described while referring to FIG. 1 to FIG. 13.

First, illumination of the mask 1 by the exposure apparatus 5 is explained. In the present embodiment, the exposure light 7 (illuminating light 7a) is a KrF excimer laser light of which wavelength $\lambda$ is 246 nm. A numerical aperture $NA_p$ of the projecting optical system 9 of the exposure apparatus 5 is set at 0.68.

The coherency $\sigma$ of the illuminating optical system 8 is determined in the following formula (1) assuming a numerical aperture of the illuminating optical system 8 to be $NA_i$.

$$\sigma = NA_i/NA_p \quad (1)$$

In the present embodiment, the illuminating coherency $\sigma$ of the exposure apparatus 5 can be extended to a maximum of 0.85 $\sigma$. In the present embodiment, the mask-pattern 4 formed in the mask 1 is illuminated from a direction of center of illumination at a point located off a direction along the optical axis 16 of the exposure apparatus 5. To realize such illumination (exposure) in a so-called off-axis state, in the present embodiment, a value of 0.3 $\sigma$ is used as the value of $\sigma$. When illumination in this off-axis state is standardized optically, the relation between the location amount (off-axis amount) off the optical axis 16 of the illuminating light source 6 and the magnitude of the illuminating light source 6 can be schematically defined as shown in FIG. 2.

Figure 2:
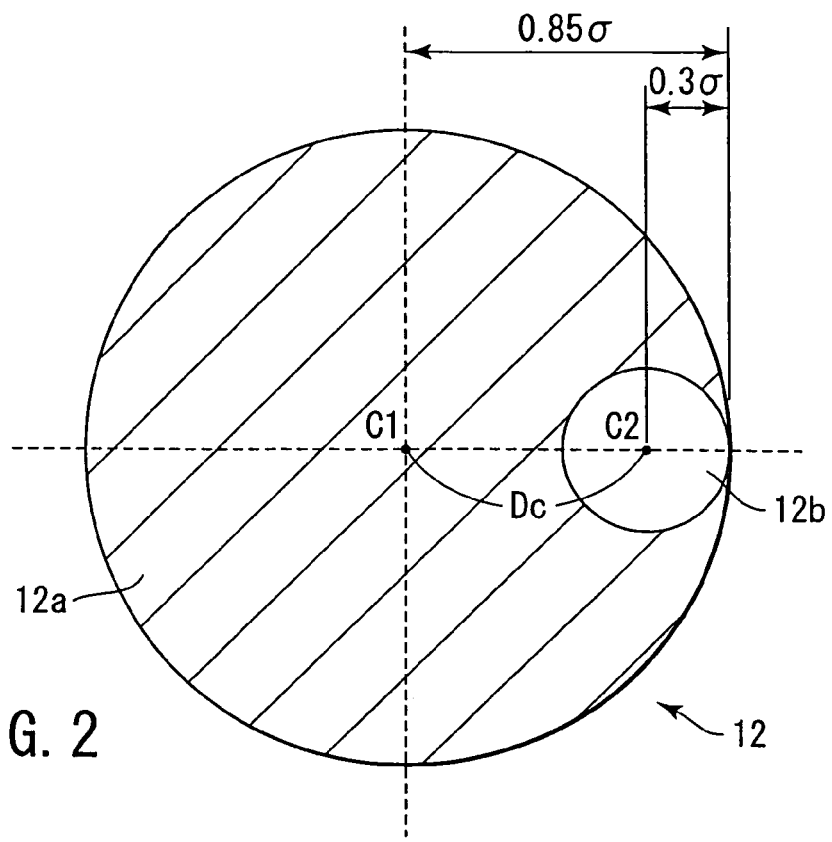
FIG. 2 is a diagram schematically showing an off-axis amount of an illuminating light according to the first and second embodiments of the invention.

To realize illumination in an off-axis state schematically shown in FIG. 1 and FIG. 2, in the present embodiment, the illuminating aperture 12 is used. The illuminating aperture 12 is composed of a shield 12a for shielding the illuminating light 7a emitted from the illuminating light source 6, and a light pass hole 12b provided to penetrate through the shield 12a for allowing to pass the illuminating light 7a emitted from the illuminating light source 6. The shield 12a is formed in a circle of which radius is equivalent to a maximum value of 0.85 $\sigma$ of the illuminating coherency $\sigma$ of the exposure apparatus 5 so that the majority of the illuminating light 7a emitted from the illuminating light source 6 may be shielded. The light pass hole 12b is formed in a circle of which radius is equivalent to 0.3 $\sigma$ of a substantial illuminating coherency $\sigma$ of the exposure apparatus 5 in an off-axis state so that part of the illuminating light 7a may be allowed to pass.

Further, as shown in FIG. 2, the light pass hole 12b is disposed at a position having a center C2 thereof located off a predetermined amount Dc from a center C1 of the shield 12a. The location amount Dc of the light pass hole 12b is set larger than the radius of the light pass hole 12b so that the center C1 of the shield 12a may not be included in the light pass hole 12b.

The illuminating aperture 12 thus explained is disposed so that the center C1 of the shield 12a may coincide with the optical axis 16 (center of the optical axis 16) of the exposure apparatus 5. As a result, the exposure light 7 emitted from the illuminating light source 6 is shielded in majority by the shield 12a, and only the exposure light 7 passing through the light pass hole 12b becomes an illuminating light 7a, which reaches up to a pupil in an illuminating lens 10 of the illuminating optical system 8. In this case, the illuminating light source 6 is set so that its center may be located by the predetermined amount Dc substantially off the center of the optical axis 16 of the exposure apparatus 5. Accordingly, the mask-pattern 4 formed in the mask 1 can be illuminated from a direction of the center of illumination at a point located off a direction along the optical axis 16 of the exposure apparatus 5. Specifically, as indicated by blank arrow in FIG. 1, a principal ray 15 of the exposure light 7 (illuminating light 7a) can be illuminated from a direction inclined from the optical axis 15 with respect to the mask-pattern 4. The principal ray 15 illuminated in an off-axis illuminating state reaches up to the image-receiving element 13 as part of the exposure light 7 (projecting light 7c) substantially along the optical path indicated by blank arrow in FIG. 1.

In the present embodiment, the image-receiving element 13 on which the image 14 of the mask-pattern 4 is exposed and projected is a semiconductor substrate 13 having a photosensitive material (photo resist) 17 applied on its principal plane (surface) 13a. Therefore, as the image of the mask-pattern 4 to be measured, a resist-pattern 14 formed by transfer on the photo resist 17 by exposure and projection is measured.

Figure 3:
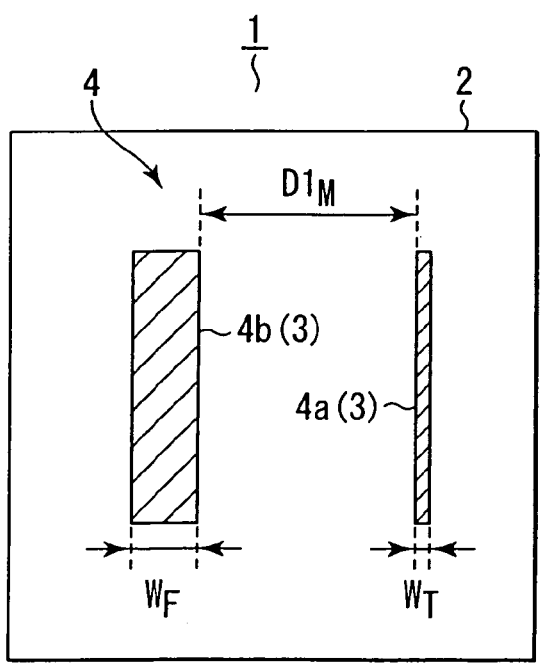
FIG. 3 is a plan view showing a mask for use in the method for inspecting an exposure apparatus according to the first embodiment.

The mask 1 used in the present embodiment and the mask-pattern 4 formed on the principal plane of the mask 1 are explained. The mask 1 is composed of a mask substrate (mask main body) 2 formed of a light permeable material such as glass, and a shield 3 formed of a light shielding material such as chromium (Cr). The mask-pattern 4 is, as shown in FIG. 3, composed of a set of first mask-pattern 4a and second mask-pattern 4b mutually different in shape. In the present embodiment, the set of first mask-pattern 4a and second mask-pattern 4b are composed of two parallel lines 4a, 4b mutually different in width.

Specifically, the first mask-pattern 4a is formed as a relatively thin line (band shape) having a specified width $W_T$ as shown in FIG. 3. By contrast, the second mask-pattern 4b is formed as a relatively thick line (band shape) having a specified width $W_F$ wider than the width $W_T$ of the first mask-pattern 4a, having the same length as the first mask-pattern 4a. The first mask-pattern 4a and second mask-pattern 4b are disposed parallel to each other at a specified spacing, across a relative interval (relative distance) $D1_M$ on the mask substrate 2. The length of the relative distance $D1_M$ is predetermined so that at least the images 14 of the first mask-pattern 4a and second mask-pattern 4b to be exposed and projected on the photo resist 17 may not overlap with each other. Substantially, the relative distance $D1_M$ between the first mask-pattern 4a and the second mask-pattern 4b is preferred to be wider than the width $W_F$ of the second mask-pattern 4b of relatively thick line. As a result, interference of the images 14 of the first and second mask-patterns 4a, 4b on the photo resist 17 can be ignored.

The mask 1 having such mask-pattern 4 formed therein is illuminated by the exposure apparatus 5 in an off-axis state as described above, and the images 14 of the first mask-pattern 4a and second mask-pattern 4b are exposed and projected on the photo resist 17. The images 14 of the first and second mask-patterns 4a, 4b exposed and projected on the photo resist 17 will be explained below.

As mentioned above, the exposure apparatus 5 is an exposure apparatus of reduction projection type, and generally the mask-pattern on the mask and an image of a mask-pattern which is actually projected and exposed cannot be directly compared in their size. In the following explanation, therefore, for the ease of comparison of the mask-pattern 4 and the image 14 of the mask-pattern 4, their dimensions are shown as being set (corrected) to the same multiplying factor (reduction rate).

Figure 4:
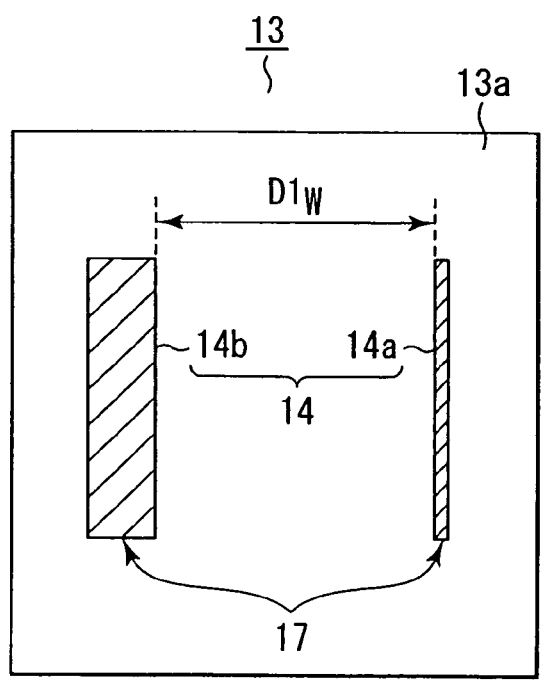
FIG. 4 is a plan view showing a resist-pattern formed on a substrate by using the mask in FIG. 3.

FIG. 4 shows the resist-pattern 14 formed on the photo resist 17 when the mask-pattern 4 is illuminated in an off-axis state setting the off-axis amount Dc from the optical axis 16 of the illuminating light source 6 at 0.3 σ. That is, the diagram shows first resist-pattern 14a and second resist-pattern 14b corresponding to the first mask-pattern 4a and second mask-pattern 4b. Herein, the relative interval (relative distance) between the first resist-pattern 14a and the second resist-pattern 14b is supposed to be $D1_W$.

Figure 5:
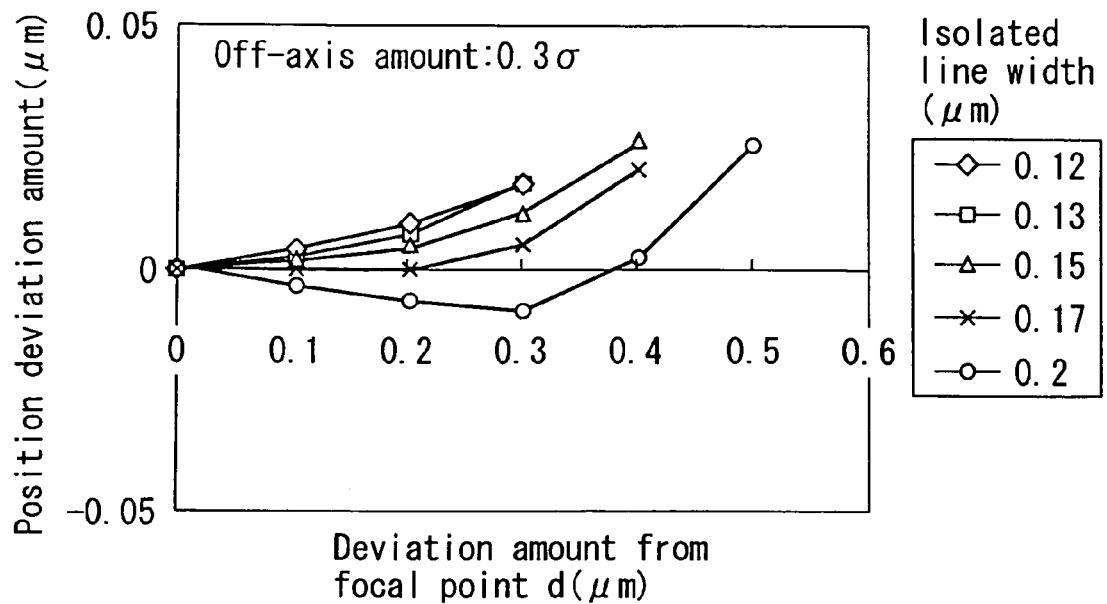
FIG. 5 is a diagram showing the relation between a position deviation amount of a thin resist-pattern formed by using the mask in FIG. 3 and a deviation amount from a focal point of the substrate shown by thickness of each pattern.
Figure 6:
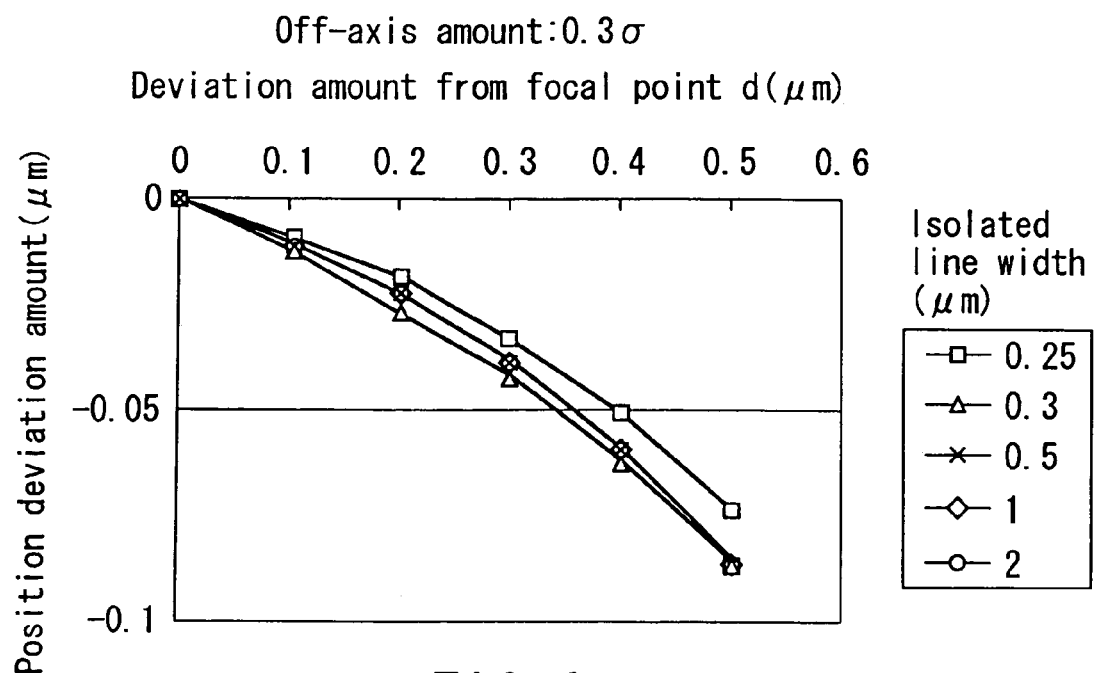
FIG. 6 is a diagram showing the relation a position deviation amount of a thick resist-pattern formed by using the mask in FIG. 3 and the deviation amount from the focal point of the substrate shown by thickness of each pattern.

At the off-axis amount Dc of the illuminating light source 6 of 0.3 σ, the relation between the position deviation amount d (defocus amount d) from the focal point (f=0) of the projecting optical system 9 (exposure apparatus 5) of the semiconductor substrate 13 (surface of the photo resist 17) and the position deviation amount from the desired projecting position of the image of a general linear mask-pattern (isolated-line-pattern) to be projected on the surface of the photo resist 17 is shown in FIG. 5 and FIG. 6 as the graph expressed by the line width of the isolated line. In FIG. 5, the width of the isolated line is 0.2 μm or less, and in FIG. 6, the width of isolated line is 0.25 μm or more. As clear from FIG. 5, the image of the mask-pattern having the width of the isolated line of 0.2 μm or less, the position deviation amount is slight regardless of the position deviation amount d from the focal point (f=0) of the semiconductor substrate 13, and it is within an ignorable measuring error range. For instance, it is about 0.02 μm at maximum. By contrast, the image of the mask-pattern having the width of the isolated line of 0.25 μm or more, as clear from FIG. 6, the position deviation is about 4 or 5 times as compared with the image of the mask-pattern having the width of the isolated line of 0.2 μm or less.

The method for inspecting an exposure apparatus of the present embodiment is characterized by investigating the state of the optical system of the exposure apparatus 5 by making use of the position deviation phenomenon depending on the width of the isolated line explained above, and the correlative relation with the position deviation amount d from the focal point (f=0) of the semiconductor substrate 13. In particular, the method for inspecting an exposure apparatus according to the first embodiment is intended to investigate the focal point (f=0) of the projecting optical system 9 (exposure apparatus 5) by making use of such correlative relation. In the present embodiment, therefore, the line width $W_T$ of the first mask-pattern 4a formed as an isolated line having a relatively thin line width is set at 0.2 μm or less, whereas the line width $W_F$ of the second mask-pattern 4b formed as an isolated line having a relatively thick line width is set at 0.25 μm or more. The first mask-pattern 4a and second mask-pattern 4b formed in such dimensions are disposed on the mask substrate 2 as shown in FIG. 3 and exposed. More specifically, the width $W_T$ of the first mask-pattern 4a is set at 0.15 μm, and the width $W_F$ of the second mask-pattern 4b is set at 1.0 μm.

Figure 7:
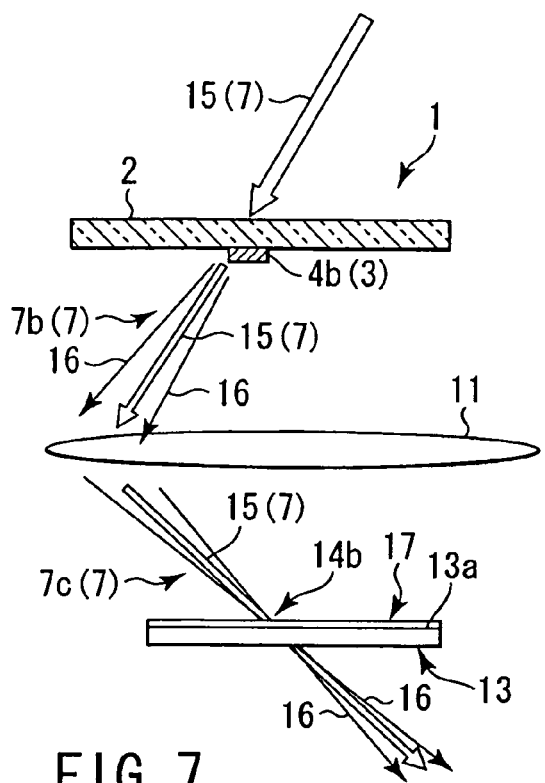
FIG. 7 is a diagram schematically showing a state of progress of a ray of exposure light entering toward a relatively thick mask-pattern.

As explained herein, in the case of using a set of mask-patterns 4a, 4b mutually different in the line width, when the relatively thick mask-pattern, that is, the second mask-pattern 4b having a line width of 1.0 μm is illuminated in an off-axis state, a second resist-pattern 14b is formed by the diffraction light 16 near the principal ray 15 only, out of the exposure light 7 as shown in FIG. 7. Therefore, when the semiconductor substrate (projecting substrate) 13 is disposed at a position deviated by a specified amount d (defocus point $F_d$) from the focal point (f=0) of the projecting optical system 9, preferably from the best focal point ($F_b$) as indicated by solid line in FIG. 1, the position at which the second resist-pattern 14b is formed is also deviated depending on the defocus amount d. In the present embodiment, for the simplicity of explanation, the focal point (f=0) of the projecting optical system 9 and the best focal point $F_b$ are the identical point.

Figure 8:
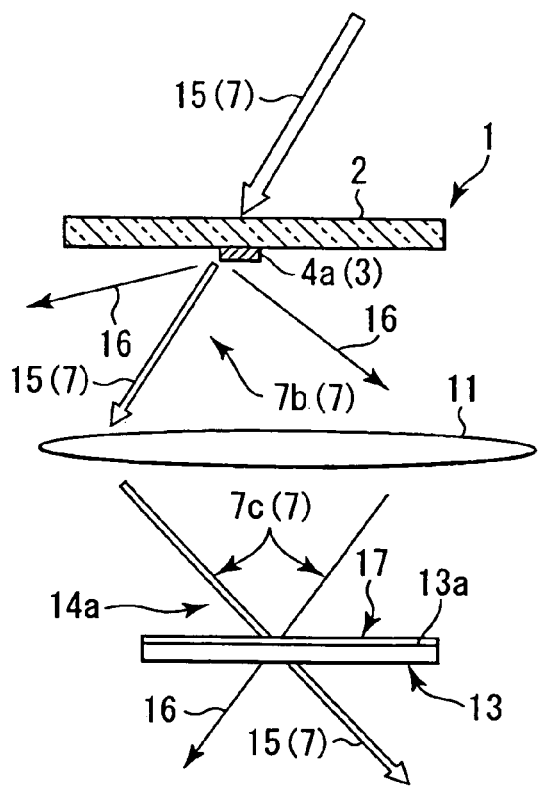
FIG. 8 is a diagram schematically showing a state of progress of a ray of exposure light entering toward a relatively thin mask-pattern.

On the other hand, when the relatively thin mask-pattern, that is, the first mask-pattern 4a having a line width of 1.5 μm is illuminated in an off-axis state, as shown in FIG. 8, the diffraction light 16 spreads around the principal ray 15. That is, by the exposure light 7 (projecting light 7c) reaching not only to part of the pupil of the projecting lens 11, but also to the photo resist 17 nearly from its entire surface, the first resist-pattern 14a is formed. Therefore, even if the semiconductor substrate 13 is disposed at the defocus point $F_d$, the position at which the first resist-pattern 14a is formed is hardly deviated.

Accordingly, by measuring the positions of the second resist-pattern 14b and first resist-pattern 14a as the images 14 after exposure and projection respectively of the second mask-pattern 4b of a relatively thick isolated line and first mask-pattern 4a of a relatively thin isolated line, the defocus amount d from the best focal point $F_b$ of the semiconductor substrate 13 can be measured.

Herein, in terms of the wavelength λ of the exposure light 7 and the numerical aperture $NA_p$ of the projecting optical system, the so-called optical standardization amount K is defined in the following formula (2).

$$K = \lambda/NAp \quad (2)$$

The line widths $W_T$, $W_F$ of the first and second mask-patterns 4a, 4b are divided by the standardization quantity K defined in the above formula (2), and expressed in standardized values, that is, standardized dimensions. Therefore, the various setting conditions of the method for inspecting an exposure apparatus of the present embodiment may be easily applied (expanded) in an exposure apparatus different in the illuminating wavelength and numerical aperture from the case of the present embodiment. Similarly, position deviation amounts of the first resist-pattern 14a and second resist-pattern 14b, or various optical quantities such as focal point (f=0) of the projecting optical system 9 can be also expressed in standardized values by dividing by K. For example, a relatively thin isolated line having a line width of 0.2 μm or less may be expressed as a line of standardized dimension of 0.55 or less, or a relatively thick isolated line having a line width of 0.25 μm or more may be expressed as a line of standardized dimension of 0.69 or more.

Figure 9:
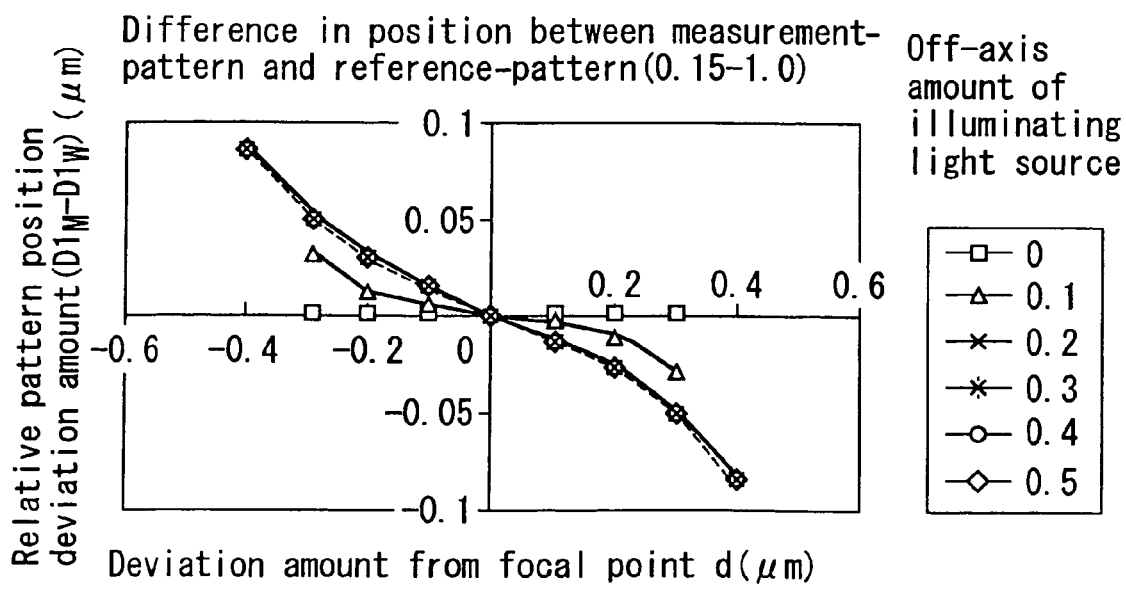
FIG. 9 is a diagram showing the relation between the relative position deviation of two kinds of resist-patterns formed by using the mask in FIG. 3 and the deviation amount from the focal point of the substrate shown by off-axis amount.

FIG. 9 is a graph showing the correlative relation between the defocus amount d from the focal point (f=0) of the projecting optical system 9 of the semiconductor substrate 13, and a relative position deviation amount ($D1_W$–$D1_M$) of the first resist-pattern 14a and second resist-pattern 14b formed on the photo resist 17, by the extent of off-axis amount (off-axis amount) of the illuminating light source 6. As clear from FIG. 9, when the off-axis amount of the illuminating light source 6 is 0.3 σ or more, the correlative relations of the defocus amount d of the semiconductor substrate 13, and the relative position deviation amount ($D1_W$–$D1_M$) of the first resist-pattern 14a and second resist-pattern 14b are substantially the same. However, if the off-axis amount of the illuminating light source 6 is 0.1 σ, the both correlative relations show evidently different behaviors.

It means that the sensitivity for detecting the focal point (f=0) of the projecting optical system 9 is lowered significantly in a state of the illuminating light source 6 substantially including the optical axis 16 even if the center of the illuminating light source 6 is set in an off-axis state located off the center of the optical axis 16. Therefore, the off-axis amount Dc from the optical axis 16 of the illuminating light source 6 in an off-axis state is preferred to be set at a value larger than the value of its illumination coherency σ. More specifically, in the present embodiment, since the value of the illuminating coherency σ of the illuminating light source 6 in the off-axis state is set at 0.3 σ, the off-axis amount Dc of the illuminating light source 6 is preferred to be set at a value larger than 0.3 σ.

In the method for inspecting an exposure apparatus of the present embodiment, as mentioned above, forming the first resist-pattern 14a and second resist-pattern 14b corresponding to the first mask-pattern 4a and second mask-pattern 4b as mentioned above, their relative distance $D1_W$ is measured. Using the value of the $D1_W$ and the value of the relative distance $D1_M$ between the first mask-pattern 4a and the second mask-pattern 4b on the mask 1, a relative position deviation amount ($D1_W$–$D1_M$) of the first resist-pattern 14a and second resist-pattern 14b is determined. This position deviation amount ($D1_W$–$D1_M$) is compared with the characteristic graphs shown in FIG. 9, depending on the exposure conditions of the exposure apparatus 5 such as the off-axis amount of the illuminating light source 6. As a result, the defocus amount d from the focal point (f=0) of the projecting optical system 9 of the semiconductor substrate 13 can be determined by suppressing in a range capable of substantially ignoring the measuring error. When measuring the relative distance $D1_W$ between the first resist-pattern 14a and the second resist-pattern 14b, a general inspection apparatus such as overlay inspection system used in general inspection of exposure apparatus can be used.

As explained herein, according to the method for inspecting an exposure apparatus of the present embodiment, it is not necessary to use any special mask or execute complicated exposure operation such as double exposure. Moreover, positioning error of the mask 1 and semiconductor substrate 13 can be eliminated, and the state of the optical system of the exposure apparatus 5 can be investigated by measuring the relative distance $D1_W$ between the first mask-pattern 4a and the second mask-pattern 4b by using a general inspection apparatus such as so-called overlay inspection system. Hence, the state of the optical system of the exposure apparatus 5 can be measured easily and promptly at low cost and high precision. In particular, in the method for inspecting an exposure apparatus of the first embodiment, the focal point (f=0) of the exposure apparatus 5 (projecting optical system 9) can be measured easily and promptly at low cost and high precision.

An exposure method for correcting a focal point in the present embodiment is described.

On the basis of the defocus amount d from the focal point (f=0) of the projecting optical system 9 of the semiconductor substrate 13 determined by the method for inspecting an exposure apparatus of the present embodiment mentioned above, the semiconductor substrate 13 is moved along the direction of the optical axis 16, and is disposed so that the surface of the photo resist 17 may coincide with the best focal point $F_b$ of the projecting optical system 9. That is, by disposing the semiconductor substrate 13 at an appropriate focal point (f=0), the focal point (f=0) of the projecting optical system 9 is substantially corrected. As a result, in a proper focused state, the image 14 of the mask-pattern 4 can be exposed, projected and transferred on the photo resist 17. Therefore, a favorable pattern transfer is realized.

As explained herein, according to the exposure method for correcting a focal point in the present embodiment, it is not necessary to use any special mask or execute complicated exposure operation such as double exposures. Moreover, positioning error of the mask 1 and semiconductor substrate 13 can be eliminated, and the focal point can be corrected and exposure by using a general inspection apparatus such as so-called overlay inspection system. Hence, the image 14 of the mask-pattern 4 of proper shape can be transferred easily and promptly at low cost and high precision. The mask-pattern for transferring the image by the exposure method for correcting a focal point of the present embodiment is not limited to the mask-pattern 4 for inspection, but may include any mask-pattern to be transferred when manufacturing semiconductor device as an actual product.

A method for manufacturing a semiconductor device of the present embodiment is described below.

The method for manufacturing a semiconductor device basically comprises a step in which the state of the optical system of the exposure apparatus 5 is inspected by the method for inspecting an exposure apparatus of the present embodiment, the optical system of the exposure apparatus 5 is set in a proper state on the basis of the result, the semiconductor substrate 13 having a photosensitive material (photo resist) 17 provided on the principal plane 13a is disposed at a proper focal point (f=0) of the projecting optical system 9 of the exposure apparatus 5, and the image of a mask-pattern for manufacturing a semiconductor device (not shown) is transferred on the photo resist 17, and a resist-pattern is formed.

In particular, the method for manufacturing a semiconductor device of the present embodiment is characterized by comprising a step in which the focal point of the projecting optical system 9 is corrected to a proper state by the exposure method for correcting a focal point of the present embodiment, the semiconductor substrate 13 having the photo resist 17 provided on the principal plane 13a is disposed at a proper focal point (f=0) of the projecting optical system 9, and the image of a mask-pattern for manufacturing a semiconductor device (not shown) is transferred on the photo resist 17, and a resist-pattern is formed.

According to the exposure method for correcting a focal point of the present embodiment mentioned above, the image of the mask-pattern 4 of a proper shape can be transferred on the photo resist 17 easily and promptly at low cost and high precision. Therefore, the method for manufacturing a semiconductor device of the present embodiment is capable of forming the resist-pattern for manufacturing semiconductor of proper shape and a proper exposure state, easily and promptly at low cost and high precision. As a result, conforming semiconductor devices can be manufactured easily and efficiently at low cost.

Figures 10, 11:
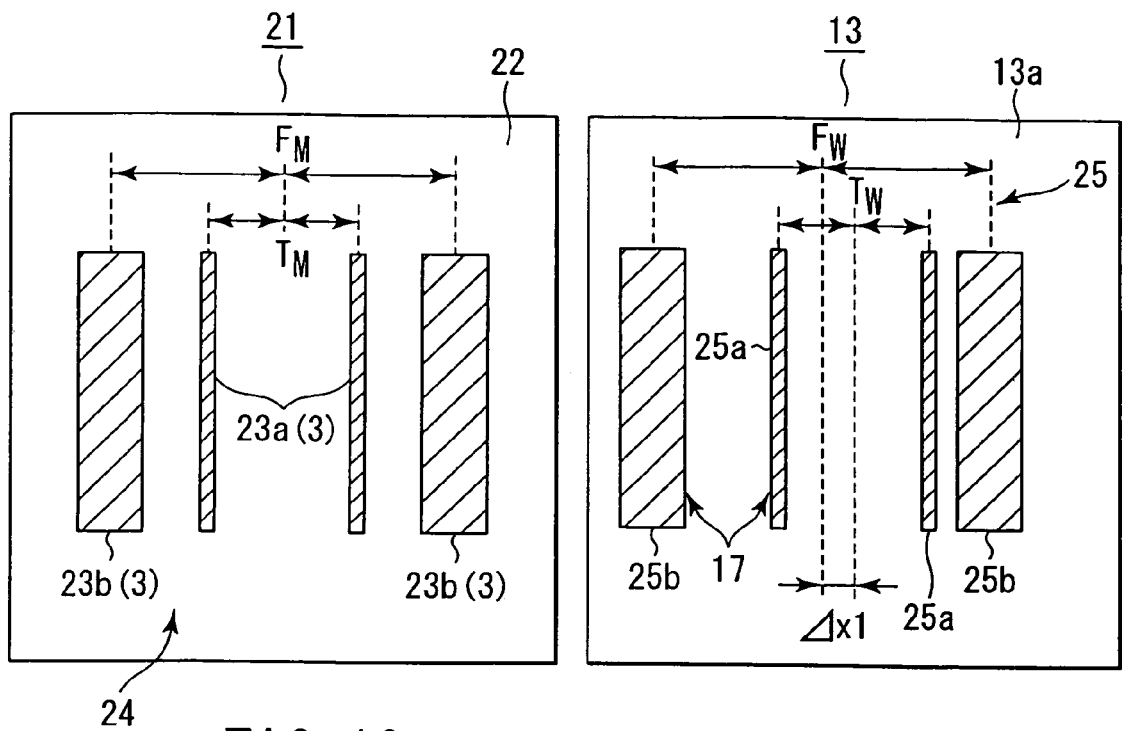
FIG. 10 is a plan view showing a modified example of the mask in FIG. 3.
FIG. 11 is a plan view showing a resist-pattern formed on a substrate by using the mask in FIG. 10.

The mask which is used in the present embodiment is not limited to the mask 1 in which a set of mask-patterns 4 consisting of the first mask-pattern 4a and second mask-pattern 4b as mentioned above is formed. For example, as shown in FIG. 10, it is also possible to use a mask 21 in which a mask-pattern 24 is formed, the mask-pattern 24 being composed by including at least one pair of mask-patterns, disposing the first mask-pattern 4a and second mask-pattern 4b on a mask substrate 22 in a mirror symmetrical configuration in their width direction.

In this mask-pattern 24, for example, a central position of a first mask-patterns 23a composed of a pair of isolated fine lines is supposed to be $T_M$, and a central position of a second mask-patterns 23b composed of a pair of isolated thick lines is supposed to be $F_M$. As shown in FIG. 10, on the mask substrate 22, the mask-pattern 24 is formed so that $T_M$ and $F_M$ may coincide with each other. In the same manner as in the method for inspecting an exposure apparatus mentioned above, the image of the mask-pattern 24 is transferred on the photo resist 17, and a resist-pattern 25 is formed as shown in FIG. 11. Herein, a central position of a first resist-patterns 25a corresponding to the pair of first mask-patterns 23a is supposed to be $T_W$, and a central position of a second resist-patterns 25b corresponding to the pair of second mask-patterns 23b is supposed to be $F_W$.

According to the principle mentioned above, the pair of first resist-patterns 25a are hardly deviated in their positions, but the pair of second resist-patterns 25b are deviated in their positions. As a result, the central position $F_W$ of the pair of second resist-patterns 25b is also deviated. The central positions $T_W$ and $F_W$ of the pair of first resist-patterns 25a not deviated in position, and the pair of second resist-patterns 25b deviated in position are measured, and on the basis of the result of measurement, the magnitude of relative interval (relative distance) $\Delta X1$ between the both central positions $T_W$ and $F_W$ is determined. This relative distance $\Delta X1$ between the both central positions $T_W$ and $F_W$ corresponds to the relative position deviation amount of the both resist-patterns 25a, 25b. That is, the relative distance $\Delta X1$ corresponds to the relative position deviation amount $(D1_W - D1_M)$ of the first resist-pattern 14a and second resist-pattern 14b mentioned above.

Therefore, by determining this position deviation amount $\Delta X1$, in the same manner as in the method for inspecting an exposure apparatus mentioned above, the defocus amount d of the semiconductor substrate 13 from the focal point (f=0) of the projecting optical system 9 can be determined at high precision. Moreover, by using the mask 21 having the mirror symmetrical mask-patterns 24 formed therein, the measuring precision of the defocus amount d can be further enhanced. Still more, the quality of semiconductor device manufactured by the method for manufacturing a semiconductor device of the present embodiment can be further enhanced.

Figures 12, 13:
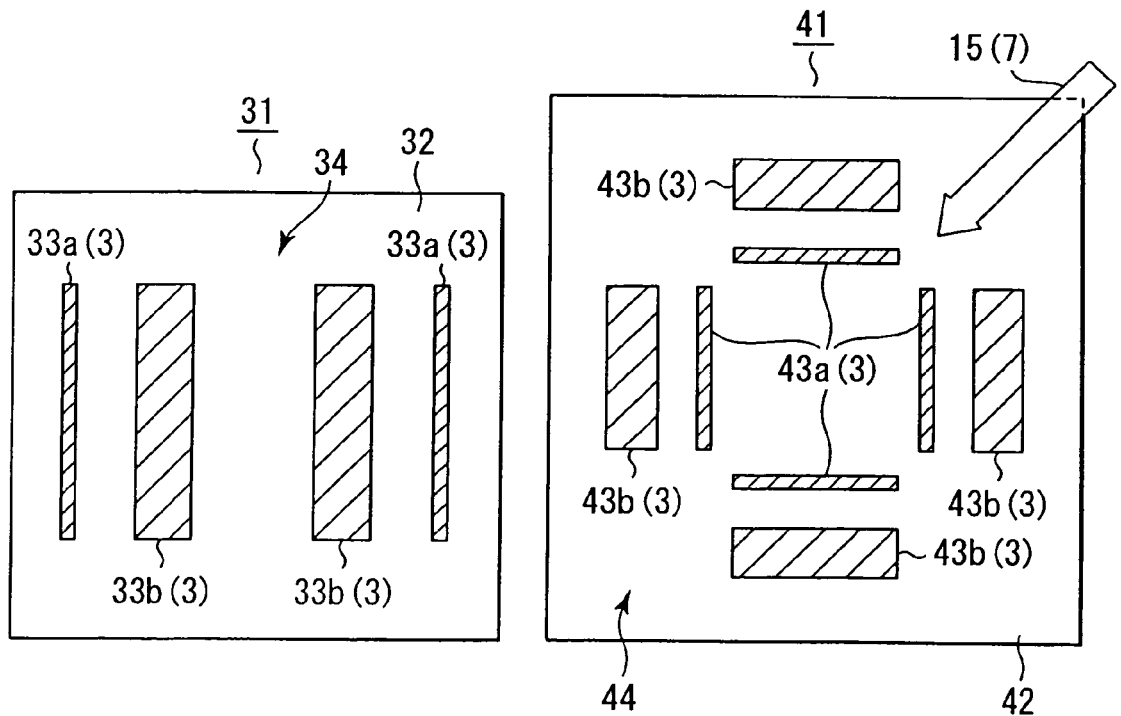
FIG. 12 is a plan view showing another modified example of the mask in FIG. 3.
FIG. 13 is a plan view showing still another modified example of the mask in FIG. 3.

The pair of first mask-patterns 23a and the pair of second mask-patterns 23b for composing the mask-pattern 24 may be also disposed by exchanging the inside and outside along their width direction. More specifically, as shown in FIG. 12, in order that a pair of first mask-patterns 33a and a pair of second mask-patterns 33b may be mutually mirror symmetrical, the pair of second mask-patterns 33b are disposed at the inside in the width direction of the pair of first mask-patterns 33a, thereby forming a mask-pattern 34 on a mask substrate 32. By using a mask 31 having such mask-pattern 34, the same effects as in the case of using the mask 21 are obtained by similarly executing the method for inspecting an exposure apparatus, exposure method for correcting a focal point, and method for manufacturing a semiconductor device according to the present embodiment.

The mask-pattern is not limited to the mirror symmetrical configuration only in one direction along the width direction as in the case of the mask-patterns 24, 34 mentioned above. For example, as shown in FIG. 13, a pair of first mask-patterns 43a and a pair of second mask-patterns 43b are disposed in a mirror symmetrical configuration in their width direction. At the same time, another pair of first mask-patterns 43a and pair of second mask-patterns 43b are disposed mirror symmetrically in their width direction, and orthogonally to the width direction of the first two pairs of mask-patterns 43a, 43b. Thus, a mask-pattern 44 composed of at least two pairs of mirror symmetrical mask-patterns may be formed on a mask substrate 42. That is, the mask-pattern 44 may be formed as a so-called bar-in-bar-pattern.

When using such mask 41 having the mask-pattern of so-called bar-in-bar-pattern such as the mask-pattern 44 formed therein, as indicated by blank arrow in FIG. 13, it may be set to illuminate the principal ray 15 of the exposure light 7 from an oblique direction to the mask-patterns 43a, 43b forming the bar-in-bar-pattern 44. At the time of defocusing, accordingly, the position deviation amount in mutually straight two directions of the images by two pairs of mirror symmetrical mask-patterns can be measured, and the measuring precision of the defocus amount d may be further enhanced. Therefore, from the focal point (f=0) of the projecting optical system 9, the defocus amount d of the semiconductor substrate 13 can be determined at higher precision. As a result, the quality of the semiconductor device manufactured by the method for manufacturing a semiconductor device of the present embodiment may be further enhanced.

Second Embodiment

A method for inspecting an exposure apparatus, an exposure method for correcting a focal point, and a method for manufacturing a semiconductor device according to a second embodiment of the invention will be described while referring to FIG. 14 to FIG. 29.

The method for inspecting an exposure apparatus, exposure method for correcting a focal point, and method for manufacturing a semiconductor device of the second embodiment are same as those of the first embodiment in the configuration and process except that the mask-pattern formed on the mask used at the time of execution is different from that in the first embodiment. Therefore, only different points are explained, and same parts as in the first embodiment are identified with same reference numerals, and their description is omitted.

In third and fourth embodiments described below, same as in the second embodiment, only the points different from the first embodiment are explained.

Figure 14:
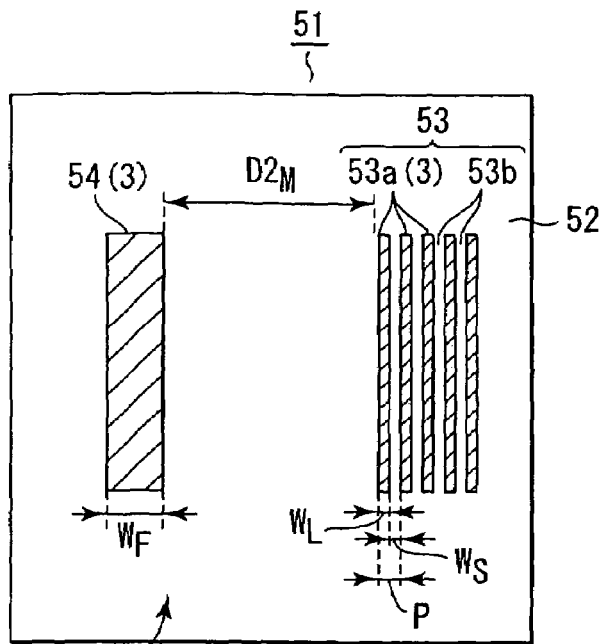
FIG. 14 is a plan view showing a mask for use in a method for inspecting an exposure apparatus according to a second embodiment of the invention.

In the method for inspecting an exposure apparatus, exposure method for correcting a focal point, and method for manufacturing a semiconductor device of the second embodiment, a mask 51 having a mask-pattern 55 as shown in FIG. 14 formed on a mask substrate 52 is used. The mask-pattern 55 is composed of a set of first mask-pattern 53 and second mask-pattern 54 mutually different in shape. The set of first mask-pattern 53 and second mask-pattern 54 are disposed parallel to each other.

Specifically, the first mask-pattern 53 is composed of a set of a plurality of parallel lines 53a by disposing, as shown in FIG. 14, relatively thin lines (bands) 53a having a specified width $W_L$ relatively at a narrow interval $W_L$, mutually spaced at an equal interval, and parallel to each other. In the following explanation, parallel lines 53a composed of a plurality of relatively thin lines are collectively called line portions 53a, and a mutual interval between line portions 53a is called a space portion 53b. The first mask-pattern 53 composed of the line portions 53a and space portions 53b is called a line-and-space-pattern (L/S-pattern) 53. A so-called pitch (pattern pitch) P of the L/S-pattern 53 can be expressed as $W_L+W_S$, where $W_L$ is the width of line portions 53a and $W_S$ is the interval between space portions 53b.

On the contrary, the second mask-pattern 54b is formed as relatively thick isolated lines (bands) having a length equal to the line portions 53a of the first mask-pattern (L/S-pattern) 53, and also having a predetermined width $W_F$ wider than the width $W_L$ of the line portions 53a of the first mask-pattern 53. In the following explanation, the second mask-pattern 54 is called the isolated-line-pattern (IL-pattern) 54.

The first mask-pattern 53 and second mask-pattern 54 are disposed parallel to each other, in a state spaced by a specified length of relative distance $D2_M$ on the mask substrate 52. The length of the relative distance $D2_M$ is preset so as to have enough size at least not to allow overlapping of the images 56, 57 of the first mask-pattern 53 and second mask-pattern 54 to be exposed and projected on the photo resist 17.

Figure 15:
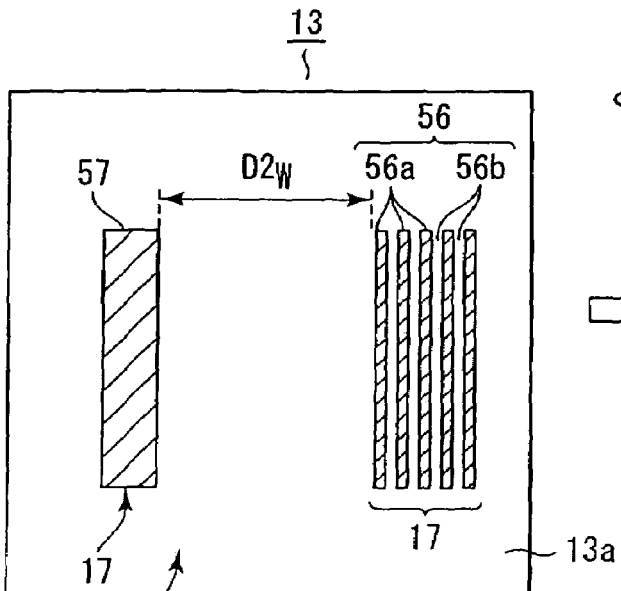
FIG. 15 is a plan view showing a resist-pattern formed on a substrate by using the mask in FIG. 14.

FIG. 15 shows a resist-pattern 58 formed on the photo resist 17 when illuminating the mask-pattern 55 in an off-axis state setting the off-axis amount Dc from the optical axis 16 of the illuminating light source 6, for example, at 0.3 σ. That is, as projected images of the first mask-pattern 53 and second mask-pattern 54, a first resist-pattern 56 and a second resist-pattern 57 are shown. The first mask resist-pattern (L/S-resist-pattern) 56 is formed as a line portion 56a and a space portion 56b in the same manner as the first mask-pattern (L/S-pattern) 53. The relative distance between the first resist-pattern 56 and the second resist-pattern 57 on the surface 13a of the semiconductor substrate 13 is supposed to be $D2_W$.

Dimensions of the L/S-pattern 53 are specifically described. To execute the present embodiment, the pitch P ($W_L+W_S$) of the L/S-pattern 53 must satisfy the following condition.

In order to form the first resist-pattern 56 and second resist-pattern 57 of proper shape suited to measurement of the defocus amount d, a diffraction light of order of 0 and a diffraction light of order of 1 generated when the exposure light 7 (illuminating light 7a) passes through the L/S-pattern 53 must both enter the pupil of the projection lens 11. The state of these diffraction lights is explained below while referring to FIG. 16. The illuminating light 7a reaching the mask 1 at incident angle α is diffracted by the L/S-pattern 4 of the pitch P, and ejected toward the projection lens 11 as a diffraction light (transmission light) 7b of diffraction angle α+β. At this time, when sin β becomes larger than the numerical aperture $NA_p$ of the projection lens 11, the diffraction light 7b cannot enter the projection lens 11. Therefore, the diffraction angle is maximum when sin α is equal to the numerical aperture $NA_i$ of the illuminating lens 10 and sin β becomes equal to the numerical aperture $NA_p$ of the projection lens 11. Accordingly, in terms of the numerical aperture $NA_p$ of the projection lens 11 and wavelength λ of the exposure light 7 (illuminating light 7a), the pitch P of the L/S-pattern 53 must satisfy the relation shown in the following formula (3).

$$P<\lambda/(NA_p+NA_i) \quad (3)$$

Figure 16:
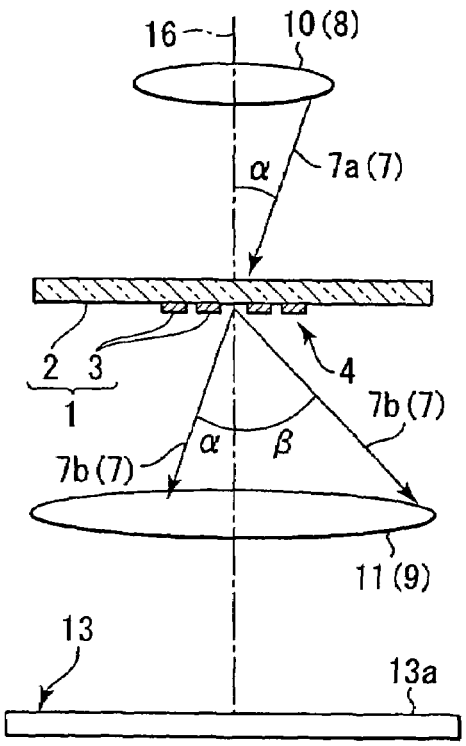
FIG. 16 is a diagram schematically showing the relation in a diffraction angle between an illuminating light entering the mask and a diffraction light generated by the mask-pattern formed on the mask.

Herein, the angles of α and β must be considered by selecting the angle closer to the optical axis 16 if the illuminating light source 6 spreads widely. In FIG. 16, the spreading case of the illuminating light source 6 is not shown.

In the present embodiment, the L/S-pattern 53 composed of parallel wires of equal interval is preferred to be formed in the condition that the position of the image 56 does not deviate (does not change) from the desired position even if the semiconductor substrate 13 is at defocus point $F_d$ (if out of focus). Accordingly, in FIG. 16, the angle α and angle 13 must be set nearly equal to each other. That is, the pitch P is desired to satisfy the relation of the following formula (4).

$$P=\lambda/2 \sin \alpha \quad (4)$$

When the relation in formula (4) is satisfied, a diffraction light of order of 0 and a diffraction light of order of 1 are in a symmetrical relation with respect to the optical axis 16, and therefore if the imaging position is deviated from the focal point (f=0) of the projecting optical system 9, the position of the image 56 is always constant. In this case, if the illuminating light source 6 spreads, a should be considered in the position of the center of the light source 6.

Figure 17:
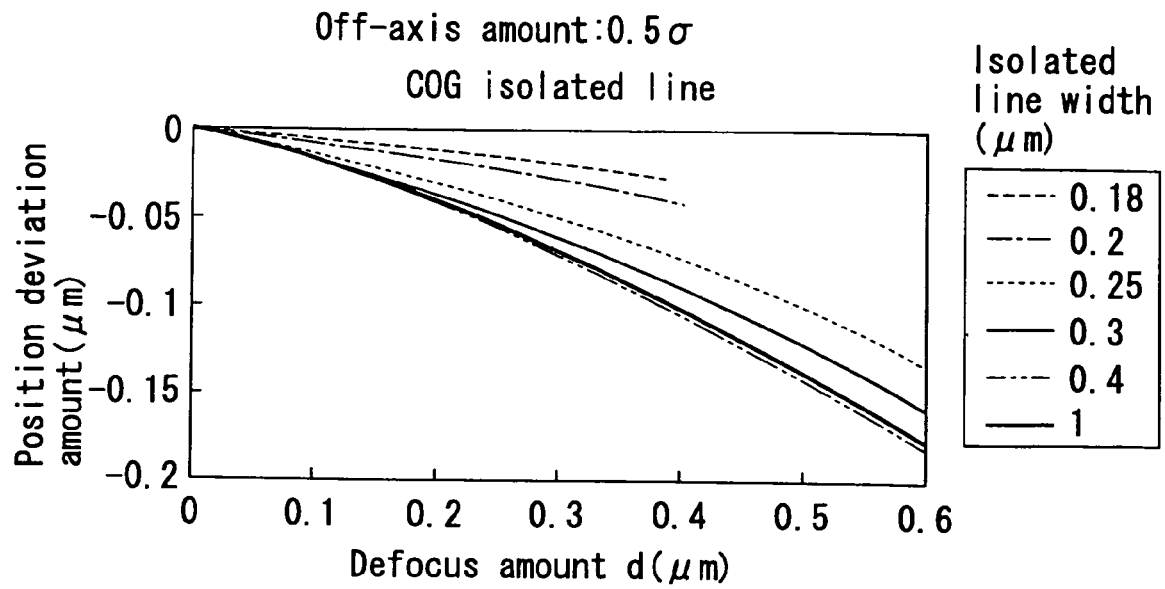
FIG. 17 is a diagram showing the relation between a position deviation amount of a resist-pattern by an isolated-line-pattern of the mask in FIG. 14 and the deviation amount from the focal point of the substrate by size of each pattern.
Figure 18:
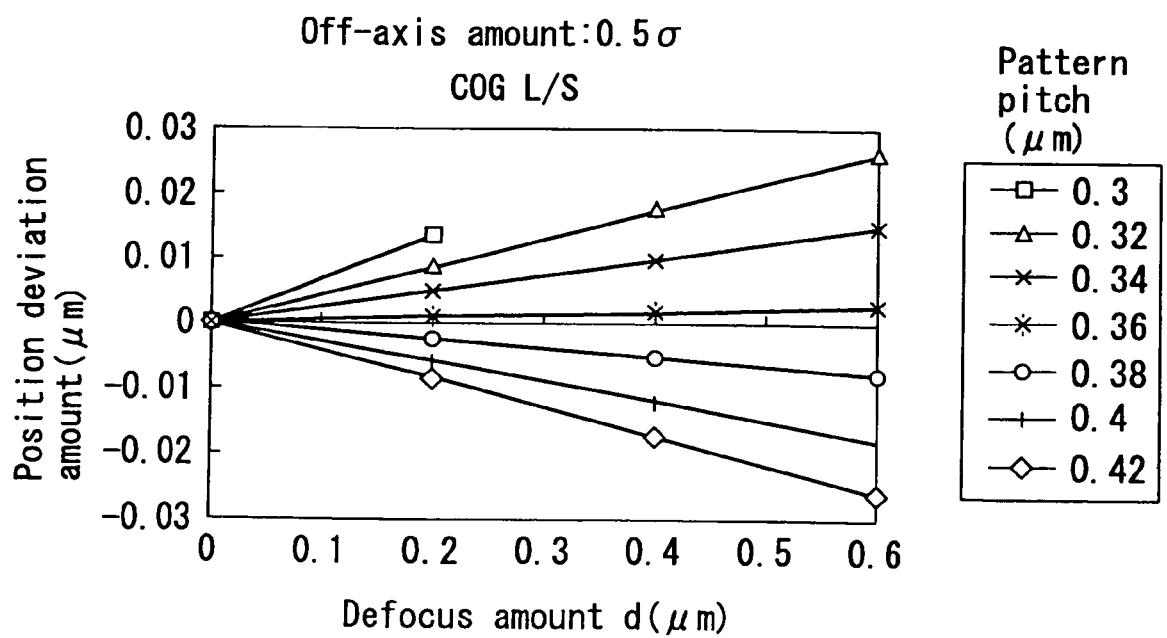
FIG. 18 is a diagram showing the relation between a position deviation amount of a resist-pattern by an L/S-pattern of the mask in FIG. 14 and the deviation amount from the focal point of the substrate by size of each pitch.

FIG. 17 and FIG. 18 are graphs expressed by each shape of a mask-pattern, showing the correlative relation of the focus amount d from the focal point (f=0) of the projecting optical system 9 of the semiconductor substrate 13, and the position deviation amount of the desired projecting position of a general mask-pattern image projected on the surface of the photo resist 17, at the off-axis amount Dc of 0.5 σ of the illuminating light source 6. FIG. 17 refers to the isolated-line-pattern 54, and FIG. 18 shows the L/S-pattern 53.

As shown in FIG. 17, as the defocus amount d increases, the position deviation amount of the exposed and projected image (second resist-pattern) 57 of the isolated-line-pattern 54 is increased. When the line width $W_F$ of the isolated-line-pattern 54 is 0.4 μm or more, the position deviation amount of the image 57 is known to be almost constant regardless of the pattern size of the isolated-line-pattern 54. When the line width $W_F$ of the isolated-line-pattern 54 is 0.2 μm or less, the position deviation amount of the image 57 is known to be relatively small as compared with the pattern of larger size. By contrast, when the line width $W_F$ of the isolated-line-pattern 54 is 0.25 μm or more, as compared with the case of the line width $W_F$ of the isolated-line-pattern 54 of 0.2 μm, the position deviation amount of the image (pattern) 57 at the time of defocusing is 2 times or more. Therefore, in the second embodiment intended to set so that the exposed and projected image of the second pattern may be deviated in position at the time of defocusing, it is desired that the line width $W_F$ of the isolated-line-pattern 54 may set larger than 0.25 μm.

Accordingly, using the standardization amount K defined in the formula (2) in the first embodiment, the line width $W_F$ of the isolated-line-pattern 54 is expressed in a standardized dimension. In the second embodiment, the wavelength λ of the exposure light 7 is 0.248 μm, and the numerical aperture $NA_p$ of the projection lens 11 (projecting optical system 9) is 0.68. Therefore, the standardization amount K is about 0.365, and the line having a width of 0.25 μm or more corresponds to the standardized dimension of 0.69 or more.

Referring next to FIG. 18, the mask-pattern of the L/S-pattern 53 is discussed. According to FIG. 18, it is known that the correlative relation of the defocus amount d from the focal point (f=0) of the projecting optical system 9 of the semiconductor substrate 13 and the position deviation amount of the exposed and projected image (first resist-pattern) 56 of the L/S-pattern 53 is different significantly depending on the size of the pitch P of the L/S-pattern 53. In particular, when the size of the pitch P is 0.36 μm, as compared with the pitch P of other sizes, it is known that the position deviation amount of the image 56 at the time of defocusing is significantly smaller. This is because the diffraction light of the exposure light 7 (transmission light 7b) passing through the L/S-pattern 53 satisfies the condition of the formula (4).

As mentioned above, the numerical aperture $NA_p$ of the projection lens 11 is 0.68 in this case, and the illumination coherency σ in off-axis state of the illuminating light source 6 is 0.5. Hence, sin α=0.34. Putting wavelength λ=248 nm in the formula (4), then P=364.7 nm, and it is known to be equal to the pitch P of the L/S-pattern 53. That is, when the size of the pitch P of the L/S-pattern 53 is set to satisfy the relation of formula (4) approximately, if the semiconductor substrate 13 is defocused, the position of the image 56 of the L/S-pattern 53 is hardly moved (shifted). Therefore, in the second embodiment intended to set so as not to cause position deviation of the exposed and projected image of the first mask-pattern at the time of defocusing, it is preferred that the size of the pitch P of the L/S-pattern 53 may be formed at about 0.36 μm.

Dimensions of the L/S-pattern 53 as the first mask-pattern and the isolated-line-pattern 54 as the second mask-pattern are set in specific size. For the isolated-line-pattern 54, as a pattern size in a region of inducing a position deviation having a substantially constant correlative relation between the position deviation amount at the time of defocusing of the image 57 and the defocus amount d of the semiconductor substrate 13, a mask-pattern having a line width $W_F$ of 1 μm is selected. For the L/S-pattern 53, as the pitch P in a size not to induce position deviation (not to shift the position of image 56) at the time of defocusing of the image 56, the pitch P having a size of 0.36 μm is selected. That is, the with $W_L$ of the line portion 53 of the L/S-pattern 53 and width $W_S$ of the space portion 53b are set at 0.18 μm each. The L/S-pattern 53 and isolated-line-pattern 54 of the specified dimensions are disposed (formed) on a mask substrate 52 parallel to each other across a relative distance $D2_M$ as shown in FIG. 14.

Using the mask 51, the image of the mask-pattern 55 composed of the L/S-pattern 53 and isolated-line-pattern 54 is exposed, projected and transferred on the photo resist 17 provided on the surface 13a of the semiconductor substrate 13 as shown in FIG. 15, and a resist-pattern 58 is formed.

FIG. 19 shows the difference, in this case, between the relative distance $D2_W$ between the L/S-pattern 53 and the isolated-line-pattern 54, and the relative distance $D2_W$ between the individual images of the first resist-pattern 56 and second resist-pattern 57, that is, a position deviation amount ($D2_W$–$D2_M$). In FIG. 19, the relative position deviation amount ($D2_W$–$D2_M$) of the first resist-pattern 56 and second resist-pattern 57 is expressed in a graph on the basis of the relative distance $D2_W$ between the both resist-patterns 56, 57 when the semiconductor substrate 13 is at the focal point (f=0) of the projecting optical system 9. That is, FIG. 19 is a graphical expression of change of relative distance $D2_W$ between both patterns 56, 57, on the basis of the case free from position deviation in both first resist-pattern 56 and second resist-pattern 57 ($D2_W$–$D2_M$=0).

As clear from FIG. 19, it is known that a certain constant correlative relation is established between the defocus amount d of the semiconductor substrate 13 and the relative position deviation amount ($D2_W$–$D2_M$) of the first resist-pattern 56 and second resist-pattern 57. Therefore, by comparing the relative position deviation amount ($D2_W$–$D2_M$) of the first resist-pattern 56 and second resist-pattern 57 with the characteristic graph shown in FIG. 19, the defocus amount d of the semiconductor substrate 13 can be determined at high precision.

In the second embodiment, as the first mask-pattern 53, a mask-pattern in a condition that the position of the exposed and projected image (pattern) 56 does not shift (does not deviate) at the time of defocusing of the semiconductor substrate 13 is selected. As the case may be, however, such mask-pattern may not be selected. For example, it may be forced to select a mask-pattern deviated in both image 56 of the L/S-pattern 53 and image 57 of the isolated-line-pattern 54. In such a case, however, the dimensions (pitch and shape) of the L/S-pattern 53 and isolated-line-pattern 54 may be formed so that the deviation amounts of the images 56, 57 may be different from each other. As a result, by measuring the relative distance $D2_W$ between the image 57 of the isolated-line-pattern 54 and the image 56 of the L/S-pattern 53 at a periodic specific pitch P, the defocus amount d of the semiconductor substrate 13 can be determined.

When using a pattern (L/S-pattern) having a predetermined periodic pitch P as the first mask-pattern 53 or second mask-pattern 54, since the patterns at both outsides in the width direction of each mask-pattern group are not periodic, the position deviation amount of each image is different. Accordingly, if a more accurate measurement is desired, it is desired to remove the image of the mask-patterns at both outsides in the width direction of the periodic-pattern (L/S-pattern) from the position-measuring region.

As one means, as shown in FIG. 20 and FIG. 21, for example, a mask 51 having a periodic-pattern 53, which includes 53a and 53b, as a mask-pattern A formed therein and a mask 61 having openings 60a, 60b as a mask-pattern B formed therein for emitting light to line portions 59a, 59b in the both outside portions in the width direction of the periodic-pattern 53 are prepared on the mask substrate 62 formed of a light shielding material. After exposing the periodic-pattern 53 on the semiconductor substrate 13, the openings 60a, 60b are exposed by overlapping with the periodic-pattern 53 by using the mask 61 before development. Then images of both mask-patterns A, B are developed. As a result, on the surface 13a of the semiconductor substrate 13, a resist-pattern C as an image 64 as shown in FIG. 22 is obtained. As indicated by broken line in FIG. 22, resist-patterns 63a, 63b corresponding to the line portions 59a, 59b in the both outside portions in the width direction of the periodic-pattern 53 are dissolved and eliminated at the time of development by exposing the openings 60a, 60b. Consequently, only the resist-pattern 56, which includes 56a and 56b, corresponding to the periodic middle portion of the periodic-pattern 53 is left over.

By such method, for example, when overlapped exposure is required, even if there is a slight error in the precision of stage position, the error hardly has any effect on the position of the image (pattern) to be exposed itself. Therefore, it achieves the object of forming a resist-pattern for measuring defocus point capable of practically ignoring the stage positioning error likely to occur at the time of double exposure.

The mask which is used in the second embodiment is not limited to the mask 51 having the mask-pattern 55 composed of a set of L/S-pattern 53 and isolated-line-pattern 54 of FIG. 14 mentioned above formed therein, but may include, for example, a mask having a mask-pattern composed of periodic-pattern (L/S-pattern) formed at a specific pitch in both first mask-pattern and second mask-pattern.

Figure 23:
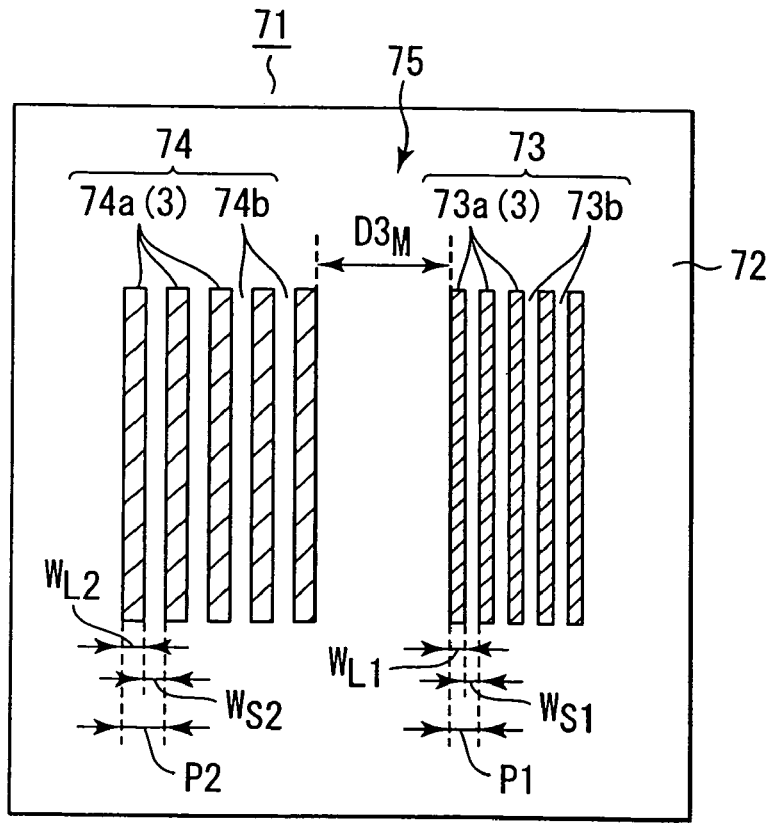
FIG. 23 is a plan view showing a modified example of the mask in FIG. 14.

For example, as shown in FIG. 23, a first mask-pattern 73 is an L/S-pattern 73 having a line width $W_{L1}$ of a line portion 73a and an interval $W_{S1}$ of a space portion 73b of 0.18 μm both, and the pitch P1 ($W_{L1}$+$W_{S1}$) of 0.36 μm. A second mask-pattern 74 is an L/S-pattern 74 having a line width $W_{L2}$ of a line portion 74a and an interval $W_{S2}$ of a space portion 74b of 0.21 μm both, and the pitch P2 ($W_{L2}+W_{S2}$) of 0.42 μm. These two L/S-pattern 73 and L/S-pattern 74 are disposed on a mask substrate 72 parallel to each other, being spaced from each other at a relative distance of $D3_M$.

Figure 24:
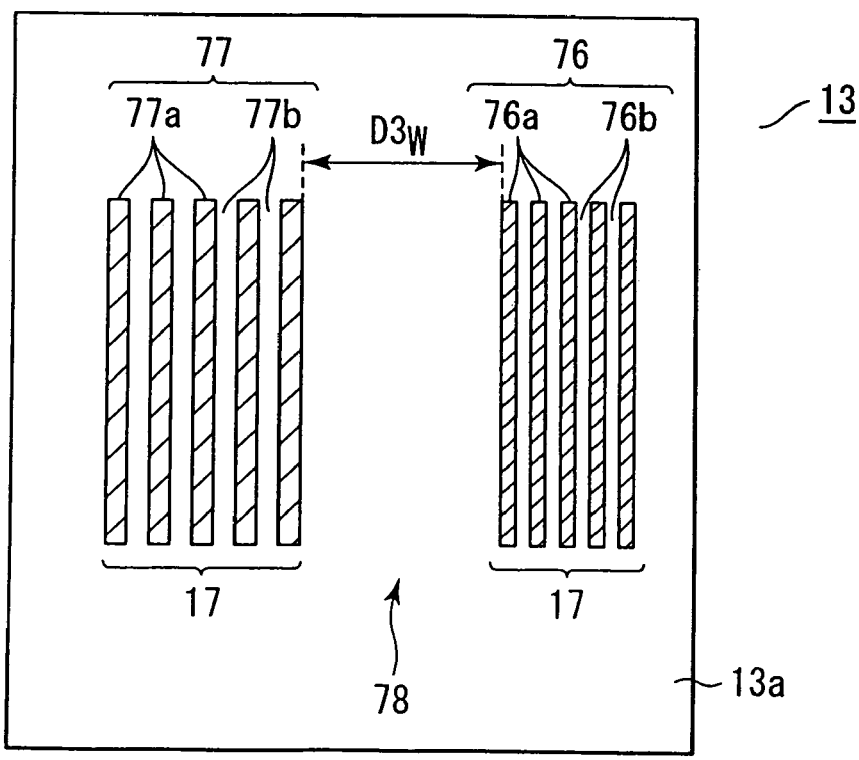
FIG. 24 is a plan view showing a resist-pattern formed on a substrate by using the mask in FIG. 23.

Using a mask 71 in which a mask-pattern 75 composed of two L/S-patterns 73, 74 thus different in pitch from each other is formed, as shown in FIG. 24, a resist-pattern 78 for measurement is formed. In the same manner as in the case of using the mask 51, a first resist-pattern (first L/S-resist-pattern) 76 as the image of the first L/S-pattern 73 is formed as a line portion 76a and a space portion 76b. Similarly, a second resist-pattern (second L/S-resist-pattern) 77 as the image of the second L/S-pattern 74 is formed as a line portion 77a and a space portion 77b. The relative distance between the first L/S-pattern 76 and the second L/S-pattern 77 on the surface 13a of the semiconductor substrate 13 is $D3_W$.

Figure 25:
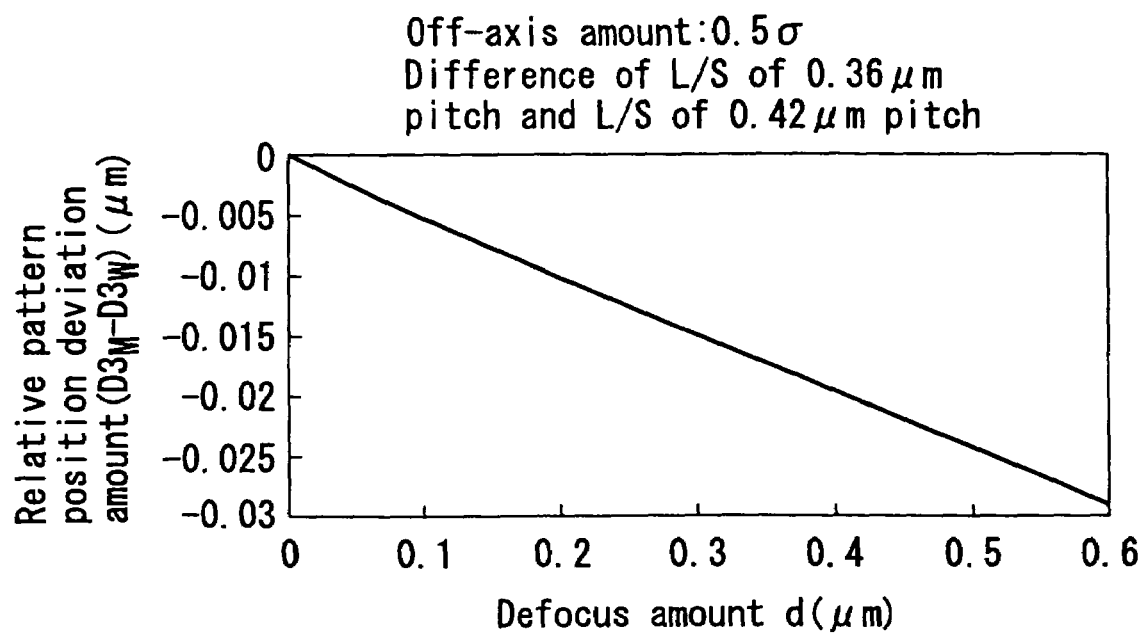
FIG. 25 is a diagram showing the relation between the relative position deviation of two kinds of resist-patterns by two kinds of L/S-patterns differing in pitch and the deviation amount from the focal point of the substrate.

In the case of using the mask 71, the defocus amount d of the semiconductor substrate 13 and a relative position deviation amount ($D3_W$–$D3_M$) of the first resist-pattern 76 and second resist-pattern 77 are known to have a substantially constant correlative relation as shown in FIG. 25. Therefore, by comparing the relative position deviation amount ($D3_W$–$D3_M$) of the first resist-pattern 76 and second resist-pattern 77 with the characteristic graph shown in FIG. 25, the defocus amount d of the semiconductor substrate 13 can be determined at high precision.

Figure 26:
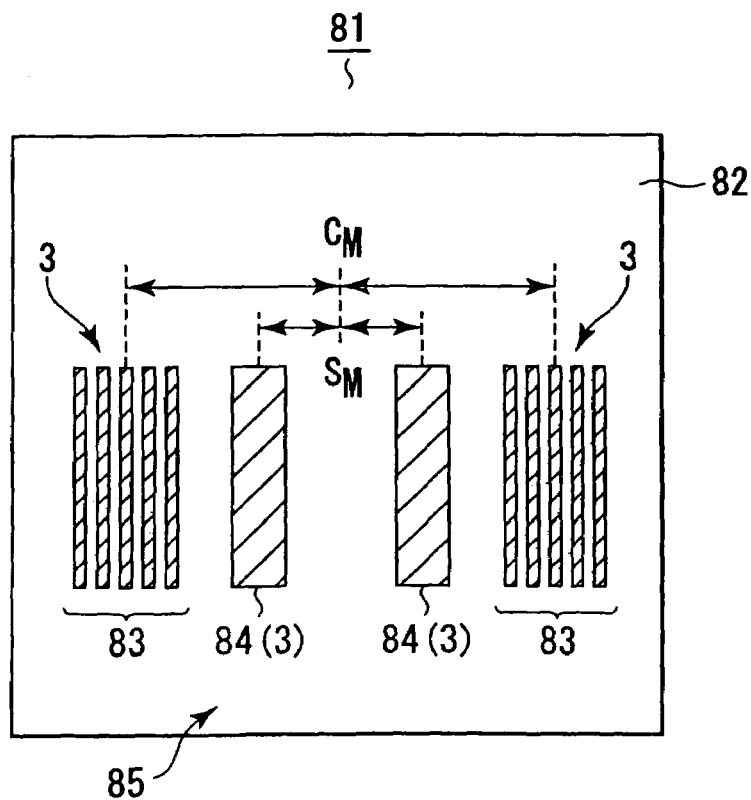
FIG. 26 is a plan view showing a modified example of the mask in FIG. 14.

Alternatively, a mask 81 having a mask-pattern 85 as shown in FIG. 26 formed therein may be used. The mask-pattern 85 formed on the mask 81 is composed of a set of mask-patterns 83 and 84 formed on the mask 81 by disposing on a mask substrate 82 mirror symmetrically to a width direction thereof.

Figure 27:
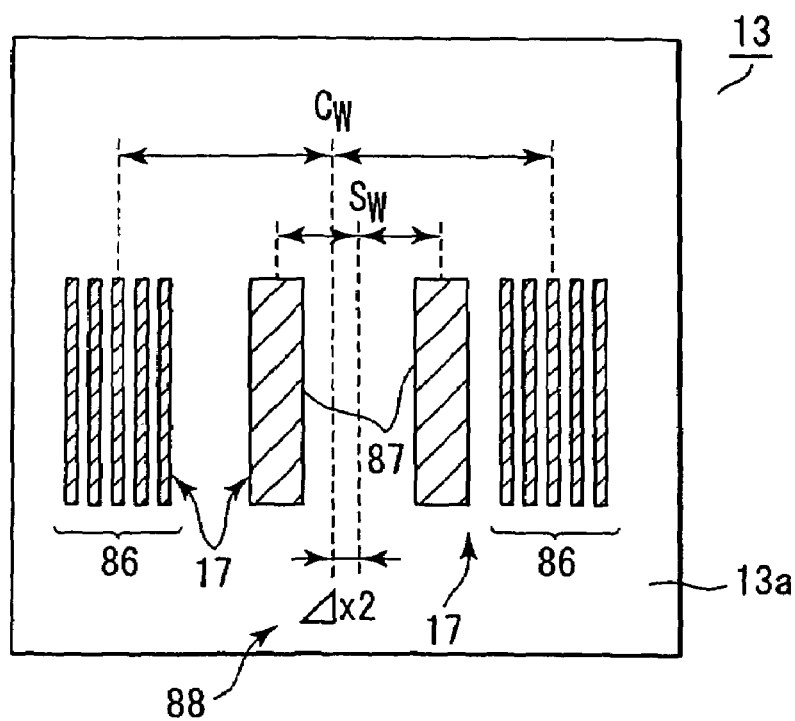
FIG. 27 is a plan view showing a resist-pattern formed on a substrate by using the mask in FIG. 26.

In this mask-pattern 85, for example, a central position of two L/S-patterns 83 is $C_M$, and a central position of two patterns 84 composed of thick isolated lines is $S_M$. As shown in FIG. 26, the mask-pattern 85 is formed so that $C_M$ and $S_M$ may coincide with each other on the mask substrate 82. As in the exposure method for exposure apparatus mentioned above, the image of the mask-pattern 85 is transferred on the photo resist 17 provided on the surface 13a of the semiconductor substrate 13, and a resist-pattern 88 is formed as shown in FIG. 27. Herein, a central position of two resist-patterns 86 by the pair of L/S-patterns 83 is $C_W$, and a central distance between two resist-patterns 87 by the pair of patterns 84 of thick isolated lines is $S_W$.

According to the principle mentioned above, the pair of resist-patterns 86 are hardly deviated in their positions, but the pair of resist-patterns 87 are deviated in their positions. As a result, the central position $S_W$ of the pair of resist-patterns 87 is also deviated. The central positions $C_W$ and $S_W$ of the pair of resist-patterns 86 not deviated in position, and the pair of resist-patterns 87 deviated in position are measured. On the basis of the result of measurement, the magnitude of relative interval (relative distance) ΔX2 between the both central positions $C_W$ and $S_W$ is determined. This relative distance ΔX2 between the both central positions $C_W$ and $S_W$ corresponds to the relative position deviation amount of the both resist-patterns 86, 87. That is, the relative distance ΔX2 corresponds to the relative position deviation amount ($D2_W$–$D2_M$) of the first resist-pattern 56 and second resist-pattern 57 mentioned above.

Therefore, by determining this position deviation amount ΔX2, in the same manner as in the case of the method for inspecting an exposure apparatus mentioned above, the defocus amount d of the semiconductor substrate 13 from the focal point (f=0) of the projecting optical system 9 can be determined at high precision. Moreover, the quality of semiconductor device manufactured by the method for manufacturing a semiconductor device of the present embodiment can be further enhanced.

Figure 28:
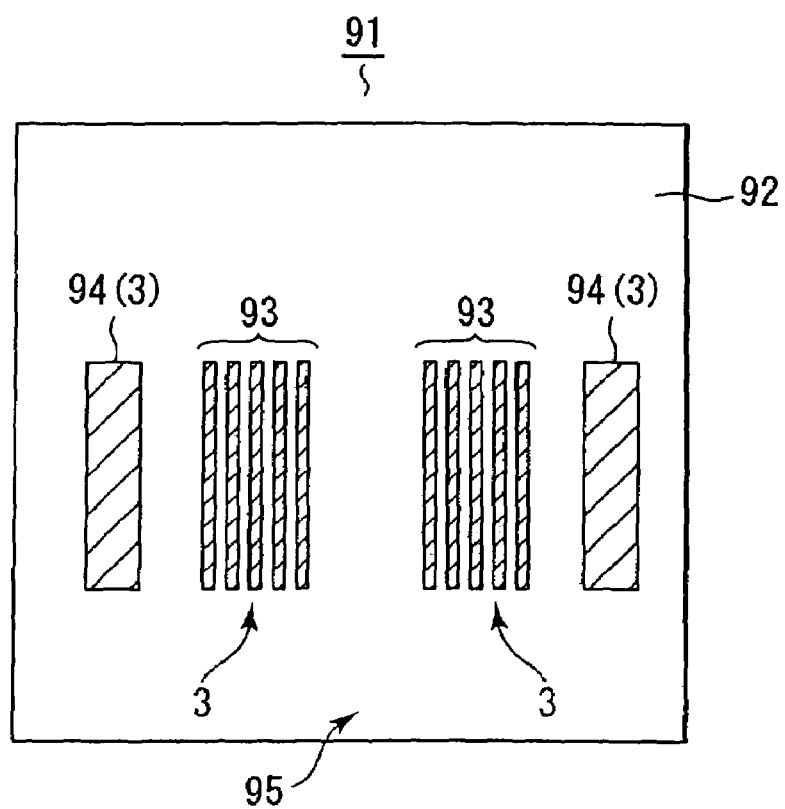
FIG. 28 is a plan view showing another modified example of the mask in FIG. 14.

The pair of L/S-patterns 83 and the pair of patterns 84 of thick isolated lines for composing the mask-pattern 85 may be also disposed by exchanging the inside and outside along their width direction. More specifically, as shown in FIG. 28, in order that a pair of L/S-patterns 93 and a pair of patterns 94 of thick isolated lines may be mutually mirror symmetrical, the pair of L/S-patterns 93 are disposed at the inside in the width direction of the pair of patterns 94 of thick isolated lines, thereby forming a mask-pattern 95 on a mask substrate 92. By using a mask 91 having such mask-pattern 95, the same effects as in the case of using the mask 81 are obtained by similarly executing the method for inspecting an exposure apparatus, exposure method for correcting a focal point, and method for manufacturing a semiconductor device according to the present embodiment.

Figure 29:
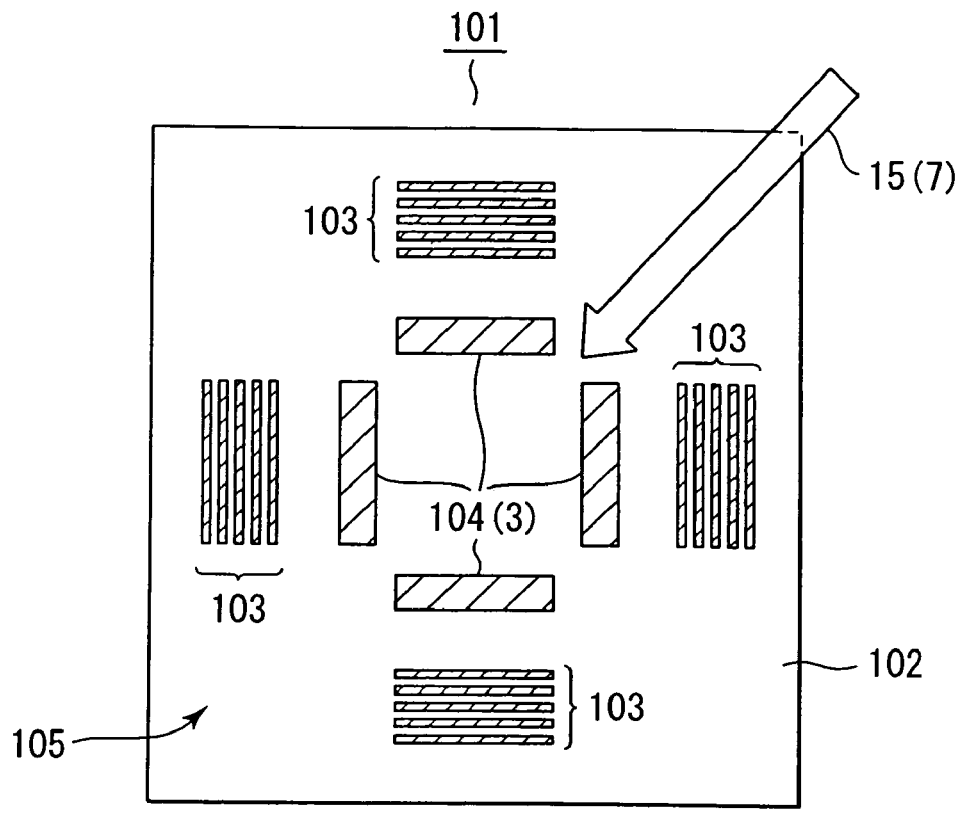
FIG. 29 is a plan view showing still another modified example of the mask in FIG. 14.

The mask-pattern is not limited to the mirror symmetrical configuration only in one direction along the width direction as in the case of the mask-patterns 85, 95 mentioned above. For example, as shown in FIG. 29, a pair of L/S-patterns 103 and a pair of patterns 104 of thick isolated lines are disposed in a mirror symmetrical configuration in their width direction. At the same time, another pair of L/S-patterns 103 and a pair of patterns 104 of thick isolated lines are disposed mirror symmetrically in their width direction, and orthogonally to the width direction of the both pairs of patterns 103, 104. Thus, a mask-pattern 105 composed of at least two pairs of mirror symmetrical mask-patterns may be formed on a mask substrate 102. That is, the mask-pattern 105 may be formed as a so-called bar-in-bar-pattern.

When using such mask 101 having the mask-pattern of so-called bar-in-bar-pattern such as this mask-pattern 105 formed therein, as indicated by blank arrow in FIG. 29, it may be set to illuminate the principal ray 15 of the exposure light 7 from an oblique direction to the patterns 103, 104 forming the bar-in-bar-pattern 105. At the time of defocusing, accordingly, the position deviation amount in mutually straight two directions of the images by two pairs of mirror symmetrical mask-patterns can be measured, and the measuring precision of the defocus amount d may be further enhanced. Therefore, the defocus amount d of the semiconductor substrate 13 from the focal point (f=0) of the projecting optical system 9 can be determined at higher precision. As a result, the quality of the semiconductor device manufactured by the method for manufacturing a semiconductor device of the present embodiment may be further enhanced.

As mentioned above, there is no problem even if the thick patterns 84, 87, 94, and 104 shown in FIG. 26 to FIG. 29 are L/S-patterns as explained in FIG. 23 and the like.

The method for inspecting an exposure apparatus, exposure method for correcting a focal point, and method for manufacturing a semiconductor device of the second embodiment are same as the method for inspecting an exposure apparatus, exposure method for correcting a focal point, and method for manufacturing a semiconductor device of the first embodiment, except for the points explained above, and the same problems to be solved by the invention can be similarly solved.

Third Embodiment

A method for inspecting an exposure apparatus, an exposure method for correcting a focal point, and a method for manufacturing a semiconductor device according to a third embodiment of the invention will be described while referring to FIG. 30.

The third embodiment is intended to illuminate the mask by setting the illuminating light source in an off-axis state substantially offset from the optical axis, without using illuminating aperture, when executing the method for inspecting an exposure apparatus, exposure method for correcting a focal point, and method for manufacturing a semiconductor device of the first and second embodiments.

Figure 30:
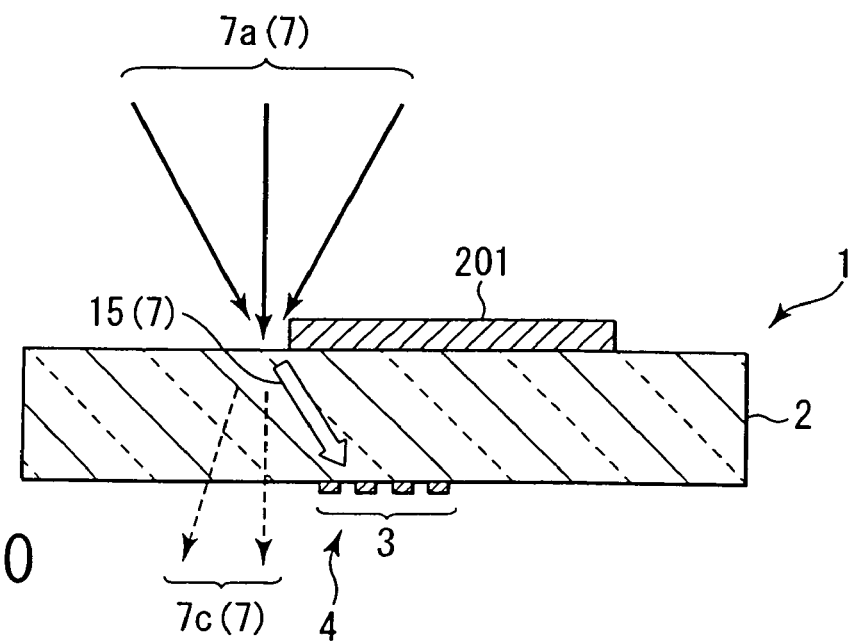
FIG. 30 is a diagram schematically showing a method for inspecting an exposure apparatus according to a third embodiment of the invention.

As shown in FIG. 30, a shield band 201 is disposed as a light shielding member at the plane position or in its vicinity at the back side (back side of pattern side, illuminating light source side principal plane) of the mask substrate 2 corresponding to the mask-pattern 4. By this shield band 201, of the exposure light 7 (illuminating light 7a) emitted from the illuminating light source 6, the exposure light 7 (illuminating light 7a) for illuminating the mask-pattern 4 along the optical axis is shielded. The shield band 201 is disposed oppositely to a region where the mask-pattern (measuring-pattern) 4 is formed, that is, to conceal the mask-pattern 4 substantially from its back side. By thus disposing the shield band 201, the illuminating light 7a entering from straightly above along the optical axis direction toward the mask-pattern 4 can be shielded. At the same time, the illuminating light 7a entering toward the mask-pattern 4 from its oblique direction can be also set in a state so that only the portion in one direction can reach the mask-pattern 4. Therefore, without using the illuminating aperture 12, the illuminating light 7a is set substantially in a state located off the center of the optical axis, so that the mask-pattern 4 can be illuminated in an off-axis state.

Fourth Embodiment

A method for inspecting an exposure apparatus, an exposure method for correcting a focal point, and a method for manufacturing a semiconductor device according to a fourth embodiment of the invention will be described while referring to FIG. 31.

The fourth embodiment is, in the same manner as in the third embodiment, intended to illuminate the mask by setting the illuminating light source in an off-axis state substantially offset from the optical axis, without using illuminating aperture.

As shown in FIG. 31, a shield band 302 is disposed as a light shielding member on a blind surface 301 nearly conjugate optically with the back side (back side of pattern side, illuminating light source side principal plane) of the mask substrate 2, or in the vicinity thereof. By illuminating the mask-pattern 4 for measurement in this state, the same effect as in the third embodiment is obtained. That is, the illuminating light 7a entering from straightly above along the optical axis direction toward the mask-pattern 4 can be shielded. At the same time, the illuminating light 7a entering toward the mask-pattern 4 from its oblique direction can be also set in a state so that only the portion in one direction can reach the mask-pattern 4. Therefore, without using the illuminating aperture 12, the illuminating light 7a is set substantially in a state located off the center of the optical axis, so that the mask-pattern 4 can be illuminated in an off-axis state.

In the third and fourth embodiments, the shield band is disposed at the illumination side from the pattern side, but the shield band may be also disposed at the projecting optical system side from the pattern side. In such configuration, by shielding part of the diffraction light passing through the pattern, an off-axis illuminating state is presented substantially.

The method for inspecting an exposure apparatus, exposure method for correcting a focal point, and method for manufacturing a semiconductor device of the invention are not limited to the first to fourth embodiments. So far as not departing from the true spirit and scope of the invention, the configuration or part of process may be changed and modified, or various settings may be combined.

The exposure apparatus to which the invention is applicable is not limited to the exposure apparatus of a telecentric optical system.

When measuring the relative position of a mask-pattern image for measuring position deviation, an electron microscope may be used as measuring means, or an optical measuring apparatus may be used. In particular, by using the so-called overlay inspection system mentioned above, measurement is easy and prompt.

The image-receiving element on which the mask-pattern is projected is not limited to the semiconductor substrate having the photo resist formed thereon as mentioned above. For example, by using a light-receiving element such as CCD, it is possible to measure by the same principle. In this case, if a filter or the like is disposed before the light-receiving element, basically, it can be handled same as exposure and projection on the semiconductor substrate.

The present invention is mainly explained about detection of the focal point of the exposure apparatus (projecting optical system), but position deviation of thick lines and thin lines is known to be caused by coma aberration of the optical system. For example, the inventors reported in Jpn. J. Appl. Phys., Vol. 37 (1998), page 3553. Further, about the relation of position deviation of the periodic-pattern and aberration, the inventors reported in Applied Optics, Vol. 38, No. 13 (1999), page 2800. Therefore, the invention is applied not only in measurement of the focal point of the exposure apparatus (projecting optical system), but also in measurement of aberration of the optical system.

In this case, the method for inspecting an exposure apparatus of the invention may be expressed as a method for inspecting an exposure apparatus characterized by illuminating a mask, in which a mask-pattern including a set of first mask-pattern and second mask-pattern mutually different in shape is formed, from a direction in which a point located off an optical axis of an exposure apparatus is a center of illumination, exposing and projecting an image of the mask-pattern toward an image-receiving element, and measuring a relative distance between images of the first and second mask-patterns exposed and projected on the image-receiving element, thereby inspecting the aberration of the optical system of the exposure apparatus.

Further, the mask-pattern for measurement (inspection) of position deviation composed of the first mask-pattern and second mask-pattern may be formed integrally with the mask having the actual mask-patterns for manufacturing a semiconductor device formed therein. In this case, to avoid mutual interference of the images by the mask-patterns, the mask-pattern for measurement of position deviation and the mask-pattern for manufacturing a semiconductor device may be spaced from each other at a specified interval.

In such configuration of the mask, inspection of the optical system of the exposure apparatus, exposure method for correcting a focal point, and an actual exposure operation (photolithographic process) can be done by using one mask.

Specifically, prior to the actual exposure operation, it is inspected whether or not the optical system of the exposure apparatus satisfies the predetermined conditions by using the mask, in any method for the first to fourth embodiments. When the predetermined conditions are satisfied, the actual exposure operation is started. If the conditions are not satisfied, the optical system of the exposure apparatus is adjusted so as to satisfy the conditions, and the actual exposure operation is started. In such manner, prior to the actual exposure operation, the optical system of the exposure apparatus is always set in an appropriate state, and a circuit-pattern of high precision can be easily transferred on a wafer. As a result, semiconductor devices of high performance can be manufactured promptly and easily.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. An exposure method for correcting a focal point, comprising:
    illuminating a mask a single time, said mask being a mask in which a mask-pattern including at least a set of a first mask-pattern and a second mask-pattern mutually different in shape is formed, from a direction in which a point located off an optical axis of an exposure apparatus is a center of illumination, using an asymmetric illumination light to the optical axis, and exposing and projecting an image of said mask-pattern toward an image-receiving element, said asymmetric illumination light having a single chief ray incidence direction;
    measuring a mutual relative distance between images of said first and second mask-patterns exposed and projected on said image-receiving element, thereby measuring a focal point of a projecting optical system of said exposure apparatus; and
    moving said image-receiving element along a direction of said optical axis of said exposure apparatus on a basis of a result of said measurement, and disposing said image-receiving element at an appropriate focal point of said projecting optical system.

2. The method according to claim 1, wherein
    said first and second mask-patterns are respectively formed in one linear shape mutually different in width, and disposed parallel to each other.

3. The method according to claim 2, wherein
    said first and second mask-patterns are formed so that a value of dividing a width of lines composing said first and second mask-patterns, by using a value obtained by dividing a wavelength of an exposure light emitted by a light source of said exposure apparatus by a numerical aperture of a projecting optical system of said exposure apparatus is 0.69 or more in said line composing one mask-pattern, and 0.55 or less in said line composing the other mask-pattern.

4. The method according to claim 3, wherein
    a location amount off said optical axis of said exposure apparatus when illuminating said mask is larger than a value obtained by dividing a numerical aperture of an illuminating optical system of said exposure apparatus by said numerical aperture of said projecting optical system of said exposure apparatus.

5. The method according to claim 1, wherein
    one of said first and second mask-patterns is formed in a shape having at least one line, and the other is formed in a shape having a plurality of lines mutually spaced from each other, and said at least one line of said first mask-patterns is formed with a different width from, and parallel to, said lines of said second mask-pattern.

6. The method according to claim 1, wherein
    said first and second mask-patterns are respectively formed in a shape having a plurality of lines spaced from each other, and widths of said lines of said first and second mask-patterns and intervals of said lines are set different from each other, and disposed parallel to each other.

7. The method according to claim 1, wherein
    said mask-pattern includes at least one pair of mask-patterns composed of said set of first and second mask-patterns and another set of first and second mask-patterns formed so as to be mirror symmetrical on a width direction of said set of first and second mask-patterns.

8. The method according to claim 7, further comprising:
    with respective to said pairs of mask-patterns, determining central positions of images of said first mask-pattern and central positions of images of said second mask-pattern, and measuring a relative distance between said central positions, thereby measuring a relative distance between said images of said first and second mask-patterns.

9. The method according to claim 7, wherein
    said mask-pattern includes at least two pair of mask-patterns composed of said pair of mask-patterns and another pair of mask-patterns formed so as to be orthogonal to a width direction of said at least one pair of mask-patterns.

10. The method according to claim 9, further comprising:
    with respect to said at least two pairs of mask-patterns, determining a central position of said mutual images of said first mask-pattern and a central position of said mutual images of said second mask-pattern, and measuring a relative distance between said mutual central positions, thereby measuring a relative distance between said mutual images of said first and second mask-patterns in two mutually orthogonal directions.

11. The method according to claim 1, wherein
    said image-receiving element is a semiconductor substrate having a photosensitive material disposed at a principal plane side on which said image of said mask-pattern is exposed and projected, and as a relative distance between said mutual images of said first and second mask-patterns, a relative distance between mutual resist-patterns with respect to said first and second mask-patterns formed on said photosensitive material is measured on a basis of said image of said exposed and projected mask-pattern.

12. The method according to claim 1, further comprising:
    providing a light shielding member disposed at a position confronting said mask-pattern, on a surface opposite to or adjacent to said side having said mask-pattern of said mask provided thereon.

13. The method according to claim 1, further comprising:
    providing a light shielding member disposed at a position of shielding an exposure light incident to said mask-pattern from a direction along said optical axis of said exposure apparatus so that said exposure light illuminating said mask enters toward said mask-pattern only from one direction located off said direction along said optical axis of said exposure apparatus, wherein said light shielding member is disposed any one of at a substantially conjugate position optically to a side opposite said side having said mask-pattern of said mask provided thereon, and adjacent to said substantially conjugate position.

14. A method for manufacturing a semiconductor device, comprising:

illuminating a mask a single time, said mask being a mask in which a mask-pattern including at least a set of a first mask-pattern and a second mask-pattern mutually different in shape is formed, said mask being illuminated from a direction in which a point located off an optical axis of an exposure apparatus is a center of illumination, using an asymmetric illumination light to the oDtical axis, and exposing and projecting an image of said mask-pattern toward an image-receiving element, said asymmetric illumination light having a single chief ray incidence direction;

measuring a mutual relative distance between images of said first and second mask-patterns exposed and projected on said image-receiving element, thereby inspecting a state of an optical system of said exposure apparatus;

setting said optical system of said exposure apparatus in an appropriate state on a basis of a result of said measurement;

disposing a semiconductor substrate having a photosensitive material provided thereon on a principal plane at an appropriate focal point of a projecting optical system of said exposure apparatus; and forming a resist-pattern by transferring an image of a mask-pattern for manufacturing a semiconductor on said photosensitive material.

15. A method for manufacturing a semiconductor device, comprising:

illuminating a mask a single time, said mask being a mask in which a mask-pattern including at least a set of a first mask-pattern and a second mask-pattern mutually different in shape is formed, said mask being illuminated from a direction in which a point located off an optical axis of an exposure apparatus is a center of illumination, using an asymmetric illumination light to the optical axis, and exposing and projecting an image of said mask-pattern toward an image-receiving element, said asymmetric illumination light having a single chief ray incidence direction;

measuring a mutual relative distance between images of said first and second mask-patterns exposed and projected on said image-receiving element, thereby measuring a focal point of a projecting optical system of said exposure apparatus;

setting said focal point of said projecting optical system in an appropriate state on a basis of a result of said measurement, and disposing a semiconductor substrate having a photosensitive material provided thereon on a principal plane at an appropriate focal point of said projecting optical system; and forming a resist-pattern by transferring an image of a mask-pattern for manufacturing a semiconductor on said photosensitive material.

\* \* \* \* \*

UNITED STATES PATENT AND TRADEMARK OFFICE
CERTIFICATE OF CORRECTION

PATENT NO. : 7,248,349 B2 Page 1 of 1
APPLICATION NO. : 11/220701
DATED : July 24, 2007
INVENTOR(S) : Sato et al.

It is certified that error appears in the above-identified patent and that said Letters Patent is hereby corrected as shown below:

Column 25, line 16, change "oDtical" to --optical--.

Signed and Sealed this

Twenty-third Day of October, 2007

JON W. DUDAS
*Director of the United States Patent and Trademark Office*